United States Patent
Song et al.

(10) Patent No.: US 12,213,367 B2
(45) Date of Patent: Jan. 28, 2025

(54) DISPLAY DEVICE

(71) Applicant: Samsung Display Co., Ltd., Yongin-si (KR)

(72) Inventors: Bokwang Song, Yongin-si (KR); Gee-Bum Kim, Yongin-si (KR); Kwang Soo Bae, Yongin-si (KR); Dae-Young Lee, Yongin-si (KR); Min Oh Choi, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 18/173,720

(22) Filed: Feb. 23, 2023

(65) Prior Publication Data

US 2023/0354670 A1    Nov. 2, 2023

(30) Foreign Application Priority Data

Apr. 28, 2022    (KR) .................... 10-2022-0052483

(51) Int. Cl.
| | | |
|---|---|---|
| *H10K 59/40* | (2023.01) | |
| *G06V 40/13* | (2022.01) | |
| *H10K 59/122* | (2023.01) | |
| *H10K 59/38* | (2023.01) | |
| *H10K 59/80* | (2023.01) | |

(52) U.S. Cl.
CPC .......... *H10K 59/40* (2023.02); *G06V 40/1306* (2022.01); *H10K 59/122* (2023.02); *H10K 59/38* (2023.02); *H10K 59/8792* (2023.02)

(58) Field of Classification Search
CPC ...... H10K 59/40; H10K 59/122; H10K 59/38; H10K 59/8792
USPC .......................................... 345/173, 174, 76
See application file for complete search history.

(56) References Cited

U.S. PATENT DOCUMENTS

| | | | |
|---|---|---|---|
| 10,705,373 B2 | 7/2020 | Zhang et al. | |
| 10,763,315 B2 | 9/2020 | Bang et al. | |
| 2021/0167144 A1 | 6/2021 | Lim et al. | |
| 2021/0249635 A1* | 8/2021 | Cho | H10K 59/121 |
| 2022/0173174 A1 | 6/2022 | Hatsumi et al. | |
| 2022/0238624 A1* | 7/2022 | Kim | H10K 59/131 |

FOREIGN PATENT DOCUMENTS

| | | |
|---|---|---|
| KR | 10-2020-0037653 A | 4/2020 |
| KR | 10-2021-0069776 A | 6/2021 |
| WO | WO 2020/165686 A1 | 8/2020 |

* cited by examiner

*Primary Examiner* — Jimmy H Nguyen
(74) *Attorney, Agent, or Firm* — Lewis Roca Rothgerber Christie LLP

(57) ABSTRACT

A display device includes: a display panel including a pixel having an emissive area, and a sensor having a sensing area; and an anti-reflection layer on the display panel, the anti-reflection layer including: a light blocking layer having a first opening overlapping with the emissive area, a second opening overlapping with the sensing area, and an intermediate opening between the first opening and the second opening; a color filter covering the first opening; an over-coating layer on the light blocking layer, and covering the color filter; and a light blocking pattern on the over-coating layer, and overlapping with an area between the intermediate opening and the first opening.

20 Claims, 15 Drawing Sheets

DISPLAY DEVICE

CROSS-REFERENCE TO RELATED APPLICATION

This application claims priority to and the benefit of Korean Patent Application No. 10-2022-0052483, filed on Apr. 28, 2022, in the Korean Intellectual Property Office, the entire disclosure of which is incorporated by reference herein.

BACKGROUND

1. Field

Aspects of embodiments of the present disclosure relate to a display device capable of biometric information recognition.

2. Description of Related Art

A display device provides various functions that enable a user to interact with the display device. For example, the display device may display an image to provide information to the user, or may sense an input of the user. Recent display devices include a function of sensing biometric information of the user. The biometric information may be recognized by using a capacitive sensing technique for sensing a change in capacitance formed between electrodes, a light sensing technique for sensing incident light using an optical sensor, or an ultrasonic sensing technique for sensing vibrations using a piezoelectric element.

The above information disclosed in this Background section is for enhancement of understanding of the background of the present disclosure, and therefore, it may contain information that does not constitute prior art.

SUMMARY

One or more embodiments of the present disclosure are directed to a display device including a sensor having improved sensing performance for biometric information recognition.

According to one or more embodiments of the present disclosure, a display device includes: a display panel including a pixel having an emissive area, and a sensor having a sensing area; and an anti-reflection layer on the display panel, the anti-reflection layer including: a light blocking layer having a first opening overlapping with the emissive area, a second opening overlapping with the sensing area, and an intermediate opening between the first opening and the second opening; a color filter covering the first opening; an over-coating layer on the light blocking layer, and covering the color filter; and a light blocking pattern on the over-coating layer, and overlapping with an area between the intermediate opening and the first opening.

In an embodiment, the emissive area and the sensing area may be spaced from each other in a first direction, and the first opening, the intermediate opening, and the second opening may be spaced from each other in the first direction.

In an embodiment, a width of the intermediate opening in the first direction may be greater than or equal to a width of the emissive area in the first direction plus a width of the sensing area in the first direction and divided by 2.

In an embodiment, two outermost lines connected with the emissive area and the sensing area, and spaced from each other in a second direction crossing the first direction may be defined, and the intermediate opening may overlap with the two outermost lines in a plan view.

In an embodiment, a width of the intermediate opening in the second direction may be the same as a width of the light blocking pattern in the second direction.

In an embodiment, the display panel may further include a pixel defining film having a first film opening defining the emissive area, and a second film opening defining the sensing area, and the intermediate opening may overlap with a portion of the pixel defining film between the first film opening and the second film opening in a plan view.

In an embodiment, in a plan view, a distance between the intermediate opening and the first film opening may be equal to a distance between the first film opening and the second film opening minus a width of the emissive area in the first direction and divided by 2.

In an embodiment, in a plan view, a distance between the intermediate opening and the second film opening may be equal to a distance between the first opening and the second opening minus a width of the sensing area in the first direction and divided by 2.

In an embodiment, the first film opening may have a smaller size than that of the first opening, and the second film opening may have a larger size than that of the second opening.

In an embodiment, the anti-reflection layer may further include an additional light blocking pattern on the over-coating layer, the additional light blocking pattern having an overlapping opening overlapping with the second opening in a plan view.

In an embodiment, the intermediate opening may be filled with a portion of the over-coating layer.

In an embodiment, the display device may further include a dummy color filter covering the second opening, and the dummy color filter and the color filter may not overlap with the intermediate opening.

In an embodiment, a portion of the light blocking pattern may overlap with the intermediate opening in a plan view.

According to one or more embodiments of the present disclosure, a display device includes: a display panel including a pixel having an emissive area, and a sensor having a sensing area; and an anti-reflection layer on the display panel, the anti-reflection layer including: a light blocking layer having a plurality of openings including a first opening overlapping with the emissive area, a second opening overlapping with the sensing area, and an intermediate opening between the first opening and the second opening; and a plurality of color filters overlapping with some of the plurality of openings. The plurality of color filters do not overlap with the intermediate opening.

In an embodiment, the anti-reflection layer may further include: an over-coating layer covering the plurality of color filters; and a light blocking pattern on the over-coating layer, and overlapping with an area between the intermediate opening and the first opening.

In an embodiment, the emissive area and the sensing area may be spaced from each other in a first direction, and the first opening, the intermediate opening, and the second opening may be spaced from each other in the first direction. A width of the intermediate opening in the first direction may be greater than or equal to a width of the emissive area in the first direction plus a width of the sensing area in the first direction and divided by 2.

In an embodiment, two outermost lines connected with the emissive area and the sensing area, and spaced from each other in a second direction crossing the first direction may be defined, and the intermediate opening may overlap with the two outermost lines in a plan view.

In an embodiment, the display panel may further include a pixel defining film having a first film opening defining the emissive area, and a second film opening defining the sensing area, and in a plan view, a distance between the intermediate opening and the first film opening may be equal to a distance between the first film opening and the second film opening minus a width of the emissive area in the first direction and divided by 2. In a plan view, a distance between the intermediate opening and the second film opening may be equal to a distance between the first opening and the second opening minus a width of the sensing area in the first direction and divided by 2.

In an embodiment, the anti-reflection layer may further include an additional light blocking pattern on the overcoating layer, the additional light blocking pattern having an overlapping opening overlapping with the second opening in a plan view.

In an embodiment, the plurality of color filters may include a dummy color filter covering the second opening, and the dummy color filter may not overlap with the intermediate opening.

BRIEF DESCRIPTION OF THE DRAWINGS

The above and other aspects and features of the present disclosure will be more clearly understood from the following detailed description of the illustrative, non-limiting embodiments with reference to the accompanying drawings.

DETAILED DESCRIPTION

Figure 1:
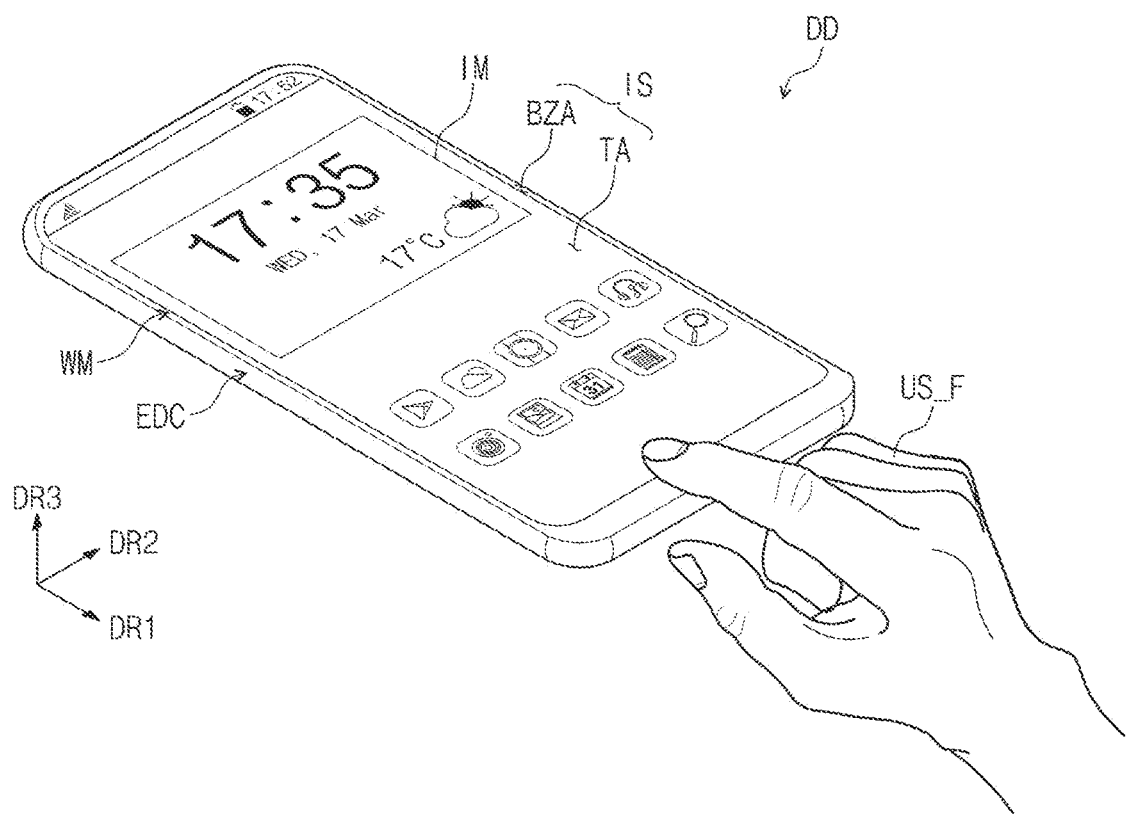
FIG. 1 is a perspective view of a display device according to an embodiment of the present disclosure.

Hereinafter, embodiments will be described in more detail with reference to the accompanying drawings, in which like reference numbers refer to like elements throughout. The present disclosure, however, may be embodied in various different forms, and should not be construed as being limited to only the illustrated embodiments herein. Rather, these embodiments are provided as examples so that this disclosure will be thorough and complete, and will fully convey the aspects and features of the present disclosure to those skilled in the art. Accordingly, processes, elements, and techniques that are not necessary to those having ordinary skill in the art for a complete understanding of the aspects and features of the present disclosure may not be described. Unless otherwise noted, like reference numerals denote like elements throughout the attached drawings and the written description, and thus, redundant description thereof may not be repeated.

When a certain embodiment may be implemented differently, a specific process order may be different from the described order. For example, two consecutively described processes may be performed at the same or substantially at the same time, or may be performed in an order opposite to the described order.

In the drawings, the relative sizes, thicknesses, and ratios of elements, layers, and regions may be exaggerated and/or simplified for clarity. Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

In the figures, the x-axis, the y-axis, and the z-axis are not limited to three axes of the rectangular coordinate system, and may be interpreted in a broader sense. For example, the x-axis, the y-axis, and the z-axis may be perpendicular to or substantially perpendicular to one another, or may represent different directions from each other that are not perpendicular to one another.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

It will be understood that when an element or layer is referred to as being "on," "connected to," or "coupled to" another element or layer, it can be directly on, connected to, or coupled to the other element or layer, or one or more intervening elements or layers may be present. Similarly, when a layer, an area, or an element is referred to as being "electrically connected" to another layer, area, or element, it may be directly electrically connected to the other layer, area, or element, and/or may be indirectly electrically connected with one or more intervening layers, areas, or elements therebetween. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments and is not intended to be limiting of the present disclosure. As used herein, the singular forms "a" and "an" are intended to include the plural forms as well, unless the context clearly indicates otherwise. It will be further understood that the terms "comprises," "comprising," "includes," "including," "has," "have," and "having," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. For example, the expression "A and/or B" denotes A, B, or A and B. Expressions such as "at least one of," when preceding a list of elements, modify the entire list of elements and do not modify the individual elements of the list. For example, the expression "at least one of a, b, or c," "at least one of a, b, and c," and "at least one selected from the group consisting of a, b, and c" indicates only a, only b, only c, both a and b, both a and c, both b and c, all of a, b, and c, or variations thereof.

As used herein, the term "substantially," "about," and similar terms are used as terms of approximation and not as terms of degree, and are intended to account for the inherent variations in measured or calculated values that would be recognized by those of ordinary skill in the art. Further, the use of "may" when describing embodiments of the present disclosure refers to "one or more embodiments of the present disclosure." As used herein, the terms "use," "using," and "used" may be considered synonymous with the terms "utilize," "utilizing," and "utilized," respectively.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Figure 2:
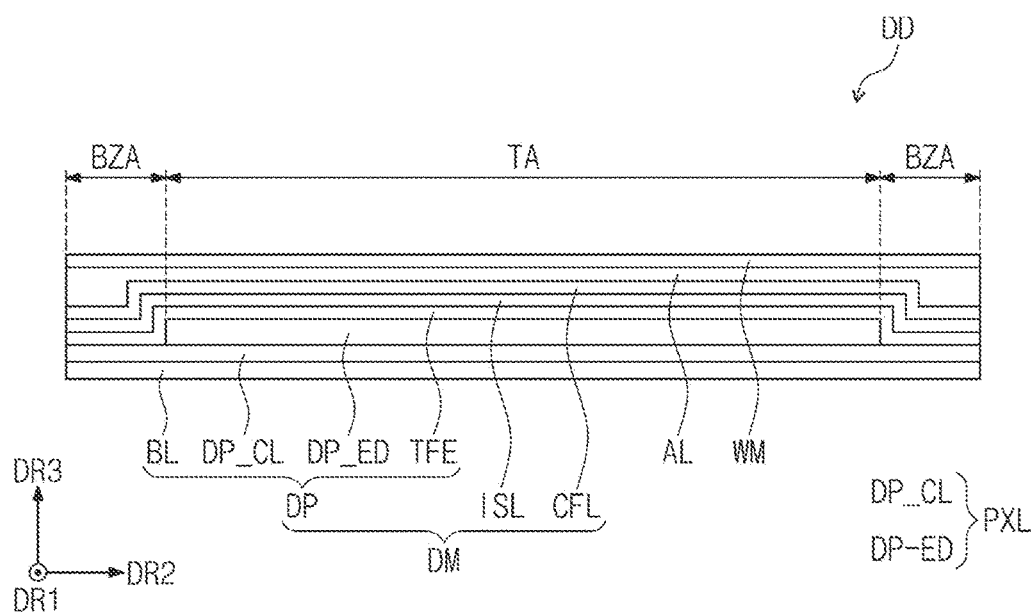
FIG. 2 is a cross-sectional view of the display device according to an embodiment of the present disclosure.

FIG. 1 is a perspective view of a display device DD according to an embodiment of the present disclosure. FIG. 2 is a cross-sectional view of the display device DD according to an embodiment of the present disclosure.

Referring to FIGS. 1 and 2, the display device DD may be a device that is activated in response to an electrical signal. For example, the display device DD may be a mobile phone, a tablet computer, a car navigation unit (e.g., a car navigation device), a game machine, or a wearable device, but the present disclosure is not limited thereto. For convenience of illustration, FIG. 1 illustrates an example in which the display device DD is illustrated as a mobile phone.

An upper surface of the display device DD may be defined as a display surface IS, and may have a plane defined by a first direction DR1 and a second direction DR2. Images IM generated by the display device DD may be provided to a user through the display surface IS. Hereinafter, a normal direction that is perpendicular to or substantially perpendicular to the plane defined by the first direction DR1 and the second direction DR2 is defined as a third direction DR3. As used herein, the expressions "when viewed on the plane" and "in a plan view" may refer to a view in/from the third direction DR3. In other words, the plane may be parallel to or substantially parallel to a surface defined by the first direction DR1 and the second direction DR2.

The display surface IS may be divided into a transmissive area TA and a bezel area BZA. The transmissive area TA may be an area where the images IM are displayed. The user may visually recognize the images IM through the transmissive area TA. In the present embodiment, the transmissive area TA is illustrated as having a rounded rectangular shape. However, the present disclosure is not limited thereto, and the transmissive area TA may have various suitable shapes and is not limited to any particular embodiment.

The bezel area BZA is adjacent to the transmissive area TA. The bezel area BZA may have a suitable color (e.g., a predetermined color). The bezel area BZA may surround (e.g., around a periphery of) the transmissive area TA. Accordingly, the shape of the transmissive area TA may be defined or substantially defined by the bezel area BZA. However, the present disclosure is not limited thereto, and the bezel area BZA may be disposed to be adjacent to one side (e.g., to only one side) of the transmissive area TA, or may be omitted as needed or desired.

The display device DD may sense an external input applied from the outside. The external input may include various suitable forms of inputs provided from outside the display device DD. For example, the external input may include a contact (e.g., a touch input) by a body part, such as the user's hand US_F, as well as an external input that is applied in proximity to the display device DD or applied adjacent to the display device DD at a suitable distance (e.g., a predetermined distance), for example, such as hovering. Furthermore, the external input may have various suitable forms, such as force, pressure, temperature, light, and/or the like. The external input may be provided by a separate device, for example, such as an active pen or a digitizer pen.

The display device DD may sense the user's biometric information applied from the outside. A biometric information sensing area capable of sensing the user's biometric information may be provided at (e.g., in or on) the display surface IS of the display device DD. The biometric information sensing area may be provided at (e.g., in or on) the entire region of the transmissive area TA, or may be provided at (e.g., in or on) a partial region of the transmissive area TA. Although FIG. 1 illustrates an example in which the entire transmissive area TA is used as the biometric information sensing area, the present disclosure is not limited thereto, and the biometric information sensing area may be provided at (e.g., in or on) a portion (e.g., a limited area) of the transmissive area TA.

An exterior of the display device DD may be formed by a window WM and a housing EDC. For example, the window WM and the housing EDC may be combined with (e.g., connected to or attached to) each other to form an inner space, and various components of the display device DD, for example, such as a display module (e.g., a display or a touch-display) DM may be accommodated in the inner space.

A front surface of the window WM defines the display surface IS of the display device DD. The window WM may contain an optically clear insulating material. For example, the window WM may include glass or plastic. The window WM may have a multi-layered structure or a single-layer structure. For example, the window WM may include a plurality of plastic films that are coupled to (e.g., connected to or attached to) one another through an adhesive, or may include a glass substrate and a plastic film that are coupled to (e.g., connected to or attached to) each other through an adhesive.

The housing EDC may contain a material having a relatively high stiffness. For example, the housing EDC may include glass, plastic, or a metal. As another example, the housing EDC may include a plurality of frames and/or plates formed of a combination of glass, plastic, and/or a metal. The housing EDC may stably protect the components of the display device DD accommodated in the inner space from external impacts. A battery module (e.g., a battery) for supplying power used for overall operations of the display device DD may be disposed between the display module DM and the housing EDC.

The display module DM may include a display panel DP, an input sensing layer ISL, and an anti-reflection layer CFL.

The display panel DP may be a component that generates or substantially generates the images IM. The display panel DP may be an emissive display panel. For example, the display panel DP may be an organic light emitting display panel, an inorganic light emitting display panel, an organic-inorganic light emitting display panel, a quantum-dot display panel, a micro LED display panel, or a nano LED display panel. Hereinafter, for convenience, the display panel DP will be described in more detail in the context of an organic light emitting display panel.

The display panel DP includes a base layer BL, a pixel layer PXL, and an encapsulation layer TFE. The display panel DP according to one or more embodiments of the present disclosure may be a flexible display panel. However, the present disclosure is not limited thereto. For example, the display panel DP may be a foldable display panel that may be folded about a folding axis, or a rigid display panel.

The base layer BL may include a synthetic resin layer. The synthetic resin layer may be a polyimide-based resin layer, but the material thereof is not particularly limited. In addition, the base layer BL may include a glass substrate, a metal substrate, or an organic/inorganic composite substrate.

The pixel layer PXL is disposed on the base layer BL. The pixel layer PXL may include a circuit layer DP_CL and an element layer DP_ED. The circuit layer DP_CL may be disposed between the base layer BL and the element layer DP_ED.

The circuit layer DP_CL includes at least one insulating layer, and at least one circuit element. Hereinafter, the insulating layer included in the circuit layer DP_CL is referred to as the intermediate insulating layer. The intermediate insulating layer includes at least one intermediate inorganic film, and at least one intermediate organic film. The circuit element may include a pixel drive circuit for (e.g., included in) each of a plurality of pixels for displaying an image, and a sensor drive circuit for (e.g., included in) each of a plurality of sensors for recognizing external information. The external information may be biometric information. In an embodiment of the present disclosure, the sensor may be a fingerprint recognition sensor, a proximity sensor, an iris recognition sensor, or the like. Furthermore, the sensor may be an optical sensor for optically recognizing biometric information. The circuit layer DP_CL may further include signal lines connected to the pixel drive circuit and/or the sensor drive circuit.

The element layer DP_ED may include a light emitting element for (e.g., included in) each of the pixels, and a light sensing element for (e.g., included in) each of the sensors. In an embodiment of the present disclosure, the light sensing element may be a photo diode. The light sensing element may be a sensor that senses and/or reacts to light reflected by a fingerprint of the user. The circuit layer DP_CL and the element layer DP_ED will be described in more detail below with reference to FIG. 6.

The encapsulation layer TFE encapsulates the element layer DP_ED. The encapsulation layer TFE may include at least one organic film, and at least one inorganic film. The inorganic film may contain an inorganic material, and may protect the element layer DP_ED from moisture and/or oxygen. The inorganic film may include, but is not particularly limited to, a silicon nitride layer, a silicon oxy-nitride layer, a silicon oxide layer, a titanium oxide layer, or an aluminum oxide layer. The organic film may contain an organic material, and may protect the element layer DP_ED from foreign matter, such as dust particles.

The input sensing layer ISL may be formed on the display panel DP. The input sensing layer ISL may be directly disposed on the encapsulation layer TFE. According to an embodiment of the present disclosure, the input sensing layer ISL may be formed on the display panel DP by a continuous process. In other words, when the input sensing layer ISL is directly disposed on the display panel DP, an adhesive film may not be disposed between the input sensing layer ISL and the encapsulation layer TFE. In another embodiment, an adhesive film may be disposed between the input sensing layer ISL and the display panel DP. In this case, the input sensing layer ISL may not be manufactured together with the display panel DP by a continuous process, and may be manufactured separately from the display panel DP, and then fixed to the upper surface of the display panel DP by the adhesive film.

The input sensing layer ISL may sense an external input (e.g., a touch of the user), may change the sensed external input to a suitable input signal (e.g., a predetermined input signal), and may provide the input signal to the display panel DP. The input sensing layer ISL may include a plurality of sensing electrodes for sensing the external input. The sensing electrodes may sense the external input in a capacitive manner. The display panel DP may receive the input signal from the input sensing layer ISL, and may generate an image corresponding to the input signal.

The anti-reflection layer CFL may be disposed on the input sensor layer ISL. The anti-reflection layer CFL may decrease a reflectivity of external light incident from the outside of the display device DD. The anti-reflection layer CFL may be formed on the input sensing layer ISL through a continuous process. However, the present disclosure is not limited thereto. For example, the anti-reflection layer CFL may be disposed between the display panel DP and the input sensing layer ISL. The anti-reflection layer CFL may include color filters. The color filters may have a suitable arrangement (e.g., a predetermined arrangement). For example, the color filters may be arranged in consideration of the colors of light emitted by the pixels included in the display panel DP. Furthermore, the anti-reflection layer CFL may further include a black matrix that is adjacent to the color filters.

The display device DD according to an embodiment of the present disclosure may further include an adhesive layer AL. The window WM may be attached to the anti-reflection layer CFL by the adhesive layer AL. The adhesive layer AL may include an optically clear adhesive, an optically clear adhesive resin, or a pressure sensitive adhesive (PSA).

Figure 3:
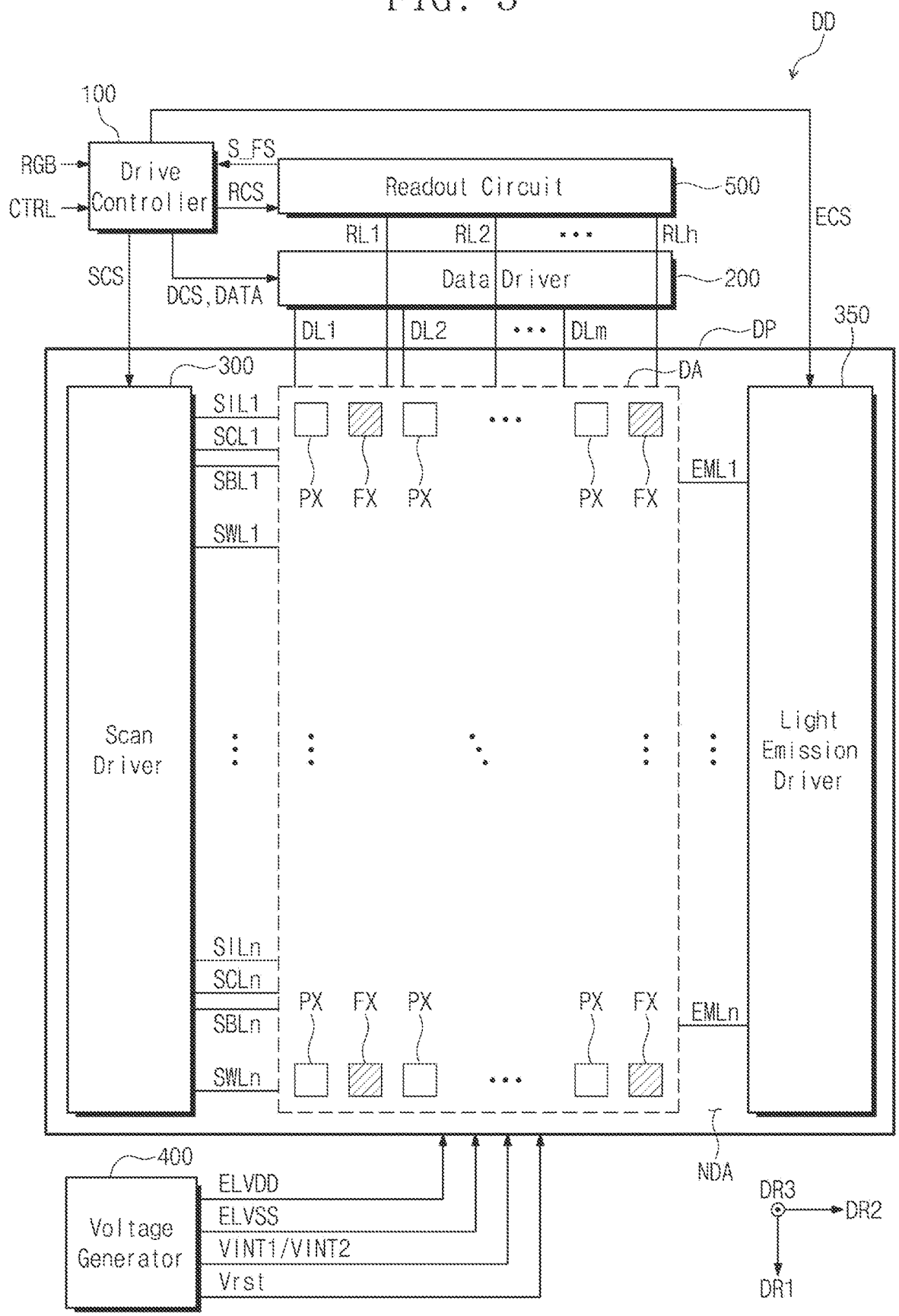
FIG. 3 is a block diagram of the display device according to an embodiment of the present disclosure.

FIG. 3 is a block diagram of the display device DD according to an embodiment of the present disclosure.

Referring to FIG. 3, the display device DD includes the display panel DP, a panel driver, and a drive controller 100. In an embodiment of the present disclosure, the panel driver includes a data driver 200, a scan driver 300, a light emission driver 350, a voltage generator 400, and a readout circuit 500.

The drive controller 100 receives an image signal RGB and a control signal CTRL. The drive controller 100 generates an image data signal DATA by converting a data format of the image signal RGB according to specifications of an interface with the data driver 200. The drive controller 100 outputs a first control signal SCS, a second control signal ECS, a third control signal DCS, and a fourth control signal RCS.

The data driver 200 receives the third control signal DCS and the image data signal DATA from the drive controller 100. The data driver 200 converts the image data signal DATA into data signals, and outputs the data signals to a plurality of data lines DL1 to DLm, which will be described in more detail below. The data signals may be analog voltages corresponding to grayscale values (e.g., gray level values) of the image data signal DATA.

The scan driver 300 receives the first control signal SCS from the drive controller 100. The scan driver 300 may output scan signals to scan lines in response to the first control signal SCS.

The voltage generator 400 generates voltages used for the operation of the display panel DP. In the present embodiment, the voltage generator 400 generates a first drive voltage ELVDD, a second drive voltage ELVSS, a first initialization voltage VINT1, a second initialization voltage VINT2, and a reset voltage Vrst.

The display panel DP may include a display area DA corresponding to the transmissive area TA (e.g., refer to FIG. 1), and a non-display area NDA corresponding to the bezel area BZA.

The display panel DP may include a plurality of pixels PX disposed at (e.g., in or on) the display area DA, and a plurality of sensors FX disposed at (e.g., in or on) the display area DA. In an embodiment of the present disclosure, each of the plurality of sensors FX may be disposed between two corresponding pixels PX that are adjacent to each other. The plurality of pixels PX and the plurality of sensors FX may be alternately disposed along the first and second directions DR1 and DR2. However, the present disclosure is not limited thereto. In other words, two or more pixels PX may be disposed between two corresponding sensors FX that are adjacent to each other in the first direction DR1 from among the plurality of sensors FX, or two or more pixels PX may be disposed between two corresponding sensors FX that are adjacent to each other in the second direction DR2 from among the plurality of sensors FX.

The display panel DP includes initialization scan lines SIL1 to SILn, compensation scan lines SCL1 to SCLn, write scan lines SWL1 to SWLn, black scan lines SBL1 to SBLn, light emission control lines EML1 to EMLn, the data lines DL1 to DLm, and readout lines RL1 to RLh. Here, each of n, m, and h is a natural number of 2 or more.

The initialization scan lines SIL1 to SILn, the compensation scan lines SCL1 to SCLn, the write scan lines SWL1 to SWLn, the black scan lines SBL1 to SBLn, and the light emission control lines EML1 to EMLn extend in the second direction DR2. The initialization scan lines SIL1 to SILn, the compensation scan lines SCL1 to SCLn, the write scan lines SWL1 to SWLn, the black scan lines SBL1 to SBLn, and the light emission control lines EML1 to EMLn may be spaced apart from each other along the first direction DR1. The data lines DL1 to DLm and the readout lines RL1 to RLh extend in the first direction DR1, and are arranged along the second direction DR2, so as to be spaced apart from each other.

The plurality of pixels PX are electrically connected to the initialization scan lines SIL1 to SILn, the compensation scan lines SCL1 to SCLn, the write scan lines SWL1 to SWLn, the black scan lines SBL1 to SBLn, the light emission control lines EML1 to EMLn, and the data lines DL1 to DLm. For example, each of the plurality of pixels PX may be electrically connected to four scan lines. However, the number of scan lines connected to each of the pixels PX may be variously modified as needed or desired without being limited thereto.

The plurality of sensors FX are electrically connected to the write scan lines SWL1 to SWLn and the readout lines RL1 to RLh. One sensor FX may be electrically connected to one scan line. However, the present disclosure is not limited thereto. The number of scan lines connected to each sensor FX may be variously modified as needed or desired. In an embodiment of the present disclosure, the number of readout lines RL1 to RLh may correspond to ½ of the number of data lines DL1 to DLm. However, the present disclosure is not limited thereto. In other embodiments, the number of readout lines RL1 to RLh may correspond to ¼ or ⅛ of the number of data lines DL1 to DLm.

The scan driver 300 may be disposed at (e.g., in or on) the non-display area NDA of the display panel DP. However, the present disclosure is not particularly limited thereto. For example, at least a portion of the scan driver 300 may be disposed at (e.g., in or on) the display area DA.

The scan driver 300 receives the first control signal SCS from the drive controller 100. In response to the first control signal SCS, the scan driver 300 outputs initialization scan signals to the initialization scan lines SIL1 to SILn, and outputs compensation scan signals to the compensation scan lines SCL1 to SCLn. Furthermore, in response to the first control signal SCS, the scan driver 300 may output write scan signals to the write scan lines SWL1 to SWLn, and may output black scan signals to the black scan lines SBL1 to SBLn. In other embodiments, the scan driver 300 may include first and second scan drivers. The first scan driver may output the initialization scan signals and the compensation scan signals, and the second scan driver may output the write scan signals and the black scan signals.

The light emission driver 350 may be disposed at (e.g., in or on) the non-display area NDA of the display panel DP. The light emission driver 350 receives the second control signal ECS from the drive controller 100. The light emission driver 350 may output light emission control signals to the light emission control lines EML1 to EMLn in response to the second control signal ECS. In other embodiments, the scan driver 300 may be connected to the light emission control lines EML1 to EMLn. In this case, the light emission driver 350 may be omitted, and the scan driver 300 may output the light emission control signals to the light emission control lines EML1 to EMLn.

The readout circuit 500 receives the fourth control signal RCS from the drive controller 100. In response to the fourth control signal RCS, the readout circuit 500 may receive sensing signals from the readout lines RL1 to RLh. The readout circuit 500 may process the sensing signals received from the readout lines RL1 to RLh, and may provide the processed sensing signals S_FS to the drive controller 100. The drive controller 100 may recognize biometric information based on the sensing signals S_FS.

Figure 4A:
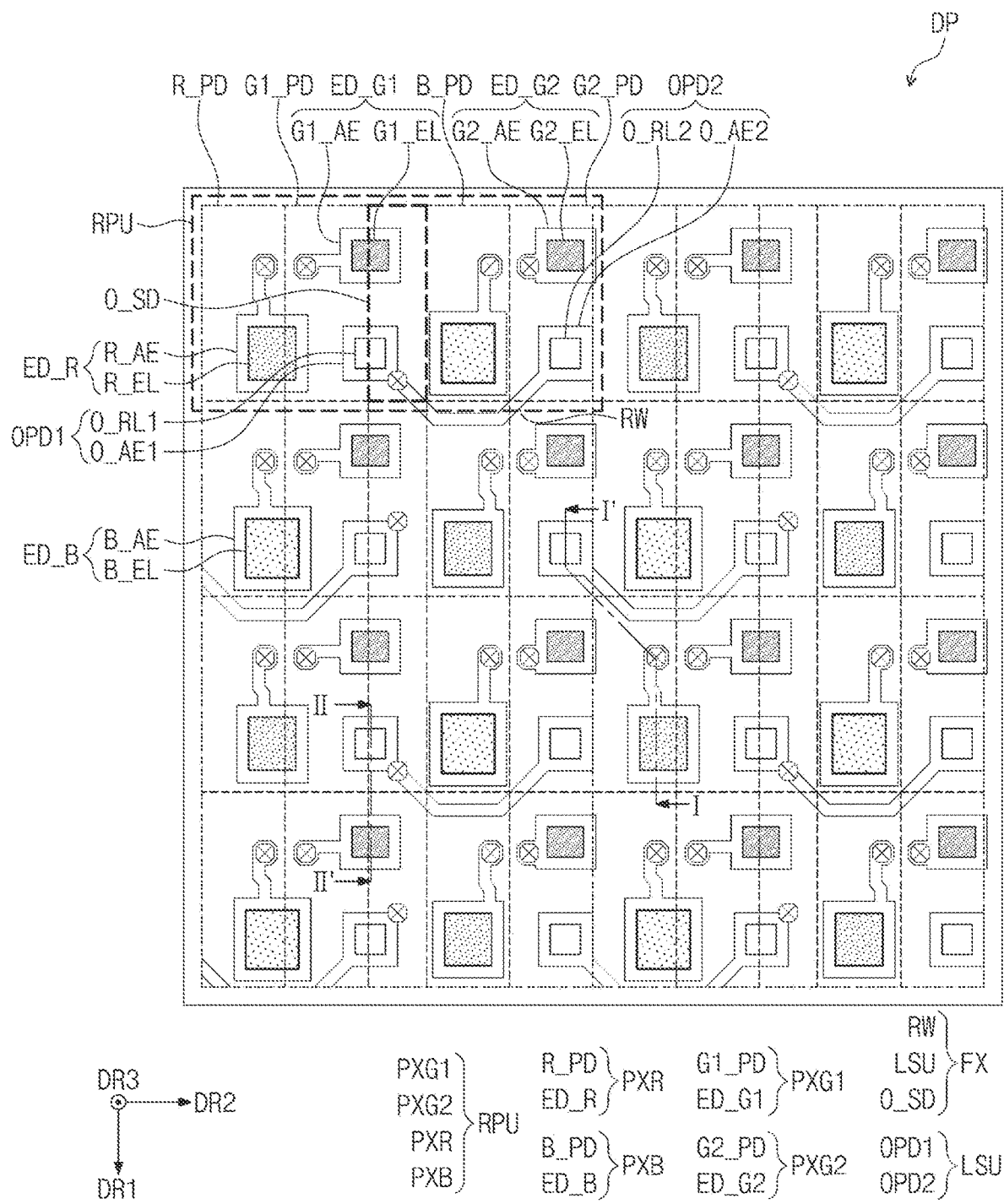
FIG. 4A is an enlarged plan view of a partial area of a display panel according to an embodiment of the present disclosure.

FIG. 4A is an enlarged plan view of a partial area of the display panel DP according to an embodiment of the present disclosure.

Referring to FIG. 4A, the display panel DP includes a plurality of pixels PXR, PXG1, PXG2, and PXB, and a plurality of sensors FX.

The plurality of pixels PXR, PXG1, PXG2, and PXB may be grouped into a plurality of reference pixel units RPU. In an embodiment of the present disclosure, each of the reference pixel units RPU may include two first pixels PXG1 and PXG2 (hereinafter, referred to as the first and second green pixels), a second pixel PXR (hereinafter, referred to as the red pixel), and a third pixel PXB (hereinafter, referred to as the blue pixel). However, the number of pixels included in each reference pixel unit RPU is not limited thereto. As another example, each reference pixel unit RPU may include three pixels, or in other words, a first green pixel PXG1 (or a second green pixel PXG2), a red pixel PXR, and a blue pixel PXB.

The first and second green pixels PXG1 and PXG2 include first light emitting elements ED_G1 and ED_G2 (hereinafter, referred to as the first and second green light emitting elements), the red pixel PXR includes a second light emitting element ED_R (hereinafter, referred to as the red light emitting element), and the blue pixel PXB includes a third light emitting element ED_B (hereinafter, referred to as the blue light emitting element). In an embodiment of the present disclosure, each of the first and second green light emitting elements ED_G1 and ED_G2 outputs a first color light (e.g., green light), the red light emitting element ED_R outputs a second color light (e.g., red light) different from the first color light, and the blue light emitting element ED_B outputs a third color light (e.g., blue light) different from the first color light and the second color light. The green light output from the first green light emitting element ED_G1 may have the same or substantially the same wavelength band as that of the green light output from the second green light emitting element ED_G2.

The red light emitting elements ED_R and the blue light emitting elements ED_B may be alternately and repeatedly disposed along the first and second directions DR1 and DR2. The first and second green light emitting elements ED_G1 and ED_G2 are alternately and repeatedly disposed along the first direction DR1, and alternately and repeatedly disposed along the second direction DR2. The first and second green light emitting elements ED_G1 and ED_G2 may be disposed in different rows and columns from those of the red light emitting elements ED_R and the blue light emitting elements ED_B along the first and second directions DR1 and DR2.

In an embodiment of the present disclosure, the red light emitting element ED_R may have a larger size than those of the first and second green light emitting elements ED_G1 and ED_G2. Furthermore, the blue light emitting element ED_B may have a size greater than or equal to the size of the red light emitting element ED_R. However, the sizes of the light emitting elements ED_R, ED_G1, ED_G2, and ED_B are not limited thereto, and may be variously modified as needed or desired. For example, in an embodiment of the present disclosure, the light emitting elements ED_R, ED_G1, ED_G2, and ED_B may have the same or substantially the same size as each other.

The first green light emitting element ED_G1 is electrically connected to a first green pixel drive circuit G1_PD. In more detail, the first green light emitting element ED_G1 includes a first green anode G1_AE and a first green light emitting layer G1_EL. The first green anode G1_AE is connected with the first green pixel drive circuit G1_PD through a contact hole. The second green light emitting element ED_G2 is electrically connected to a second green pixel drive circuit G2_PD. In more detail, the second green light emitting element ED_G2 includes a second green anode G2_AE and a second green light emitting layer G2_EL. The second green anode G2_AE is connected with the second green pixel drive circuit G2_PD through a contact hole.

The red light emitting element ED_R is electrically connected to a red pixel drive circuit R_PD. In more detail, the red light emitting element ED_R includes a red anode R_AE and a red light emitting layer R_EL. The red anode R_AE is connected with the red pixel drive circuit R_PD through a contact hole. The blue light emitting element ED_B is electrically connected to a blue pixel drive circuit B_PD. In more detail, the blue light emitting element ED_R includes a blue anode B_AE and a blue light emitting layer B_EL. The blue anode B_AE is connected with the blue pixel drive circuit B_PD through a contact hole.

Each of the sensors FX includes a light sensing unit (e.g., one or more light sensing elements) LSU and a sensor drive circuit O_SD. The light sensing unit LSU includes at least one light sensing element. In an embodiment of the present disclosure, the light sensing unit LSU includes k light sensing elements, and one of the k light sensing elements is connected to the sensor drive circuit O_SD. Here, k may be a natural number of 1 or larger. FIG. 4A illustrates one example in which k is 2. When k is 2, the light sensing unit LSU includes two light sensing elements (e.g., first and second light sensing elements OPD1 and OPD2). In an embodiment of the present disclosure, the two light sensing elements (e.g., the first and second light sensing elements OPD1 and OPD2) may be disposed to correspond to one reference pixel unit RPU. However, the number of light sensing elements that are disposed to correspond to each reference pixel unit RPU is not limited thereto. For example, one light sensing element may be disposed to correspond to one reference pixel unit RPU.

Each of the first and second light sensing elements OPD1 and OPD2 is disposed between corresponding ones of the red and blue light emitting elements ED_R and ED_B along the second direction DR2. Each of the first and second light sensing elements OPD1 and OPD2 may be disposed to be adjacent to a corresponding one of the first green light emitting elements ED_G1 or the second green light emitting elements ED_G2 along the first direction DR1. In a first reference pixel unit row, the first light sensing element OPD1 and the first green light emitting element ED_G1 are adjacent to each other in the first direction DR1, and the second light sensing element OPD2 and the second green light emitting element ED_G2 are adjacent to each other in the first direction DR1. In a second reference pixel unit row, the first light sensing element OPD1 and the second green light emitting element ED_G2 are adjacent to each other in the first direction DR1, and the second light sensing element OPD2 and the first green light emitting element ED_G1 are adjacent to each other in the first direction DR1. In an embodiment of the present disclosure, each of the first and second light sensing elements OPD1 and OPD2 is disposed between corresponding ones of the first and second green light emitting elements ED_G1 and ED_G2 that are adjacent to each other in the first direction DR1.

The sensor drive circuit O_SD is connected to one of the first and second light sensing elements OPD1 and OPD2 (e.g., such as the first light sensing element OPD1). In the first direction DR1, the sensor drive circuit O_SD may have the same or substantially the same length as those of the red and blue pixel drive circuits R_PD and B_PD. The sensor drive circuit O_SD may overlap with one of the first and second light sensing elements OPD1 and OPD2 (e.g., such as the first light sensing element OPD1) on the plane (e.g., in a plan view). The sensor drive circuit O_SD may overlap with one of the first and second green light emitting elements ED_G1 and ED_G2 (e.g., such as the first green light emitting element ED_G1) on the plane (e.g., in a plan view).

The first light sensing element OPD1 includes a first anode O_AE1 and a first photoelectric conversion layer O_RL1. The second light sensing element OPD2 includes a second anode O_AE2 and a second photoelectric conversion layer O_RL2. The first anode O_AE1 is connected (e.g., directly connected) with the sensor drive circuit O_SD through a contact hole.

Each of the sensors FX may further include a routing line RW electrically connecting the first and second light sensing elements OPD1 and OPD2 to each other. The routing line RW is electrically connected to the first anode O_AE1 and the second anode O_AE2. In an embodiment of the present disclosure, the routing line RW may be integrally formed with the first anode O_AE1 and the second anode O_AE2. The routing line RW may be referred to as a routing wire RW or a routing portion RW.

The routing line RW, the first anode O_AE1, and the second anode O_AE2 may be disposed at (e.g., in or on) the same layer as that of the anodes R_AE, G1_AE, G2_AE, and B_AE. In this case, the routing line RW, the first anode O_AE1, and the second anode O_AE2 may contain the same material as those of the anodes R_AE, G1_AE, G2_AE, and B_AE, and may be provided through the same or substantially the same process.

The first and second light sensing elements OPD1 and OPD2 may be connected to the sensor drive circuit O_SD in parallel with each other by the routing lines RW. Accordingly, the first and second light sensing elements OPD1 and OPD2 may be concurrently (e.g., simultaneously or substantially simultaneously) turned on, or may be concurrently (e.g., simultaneously or substantially simultaneously) turned off, by the sensor drive circuit O_SD.

Figure 4B:
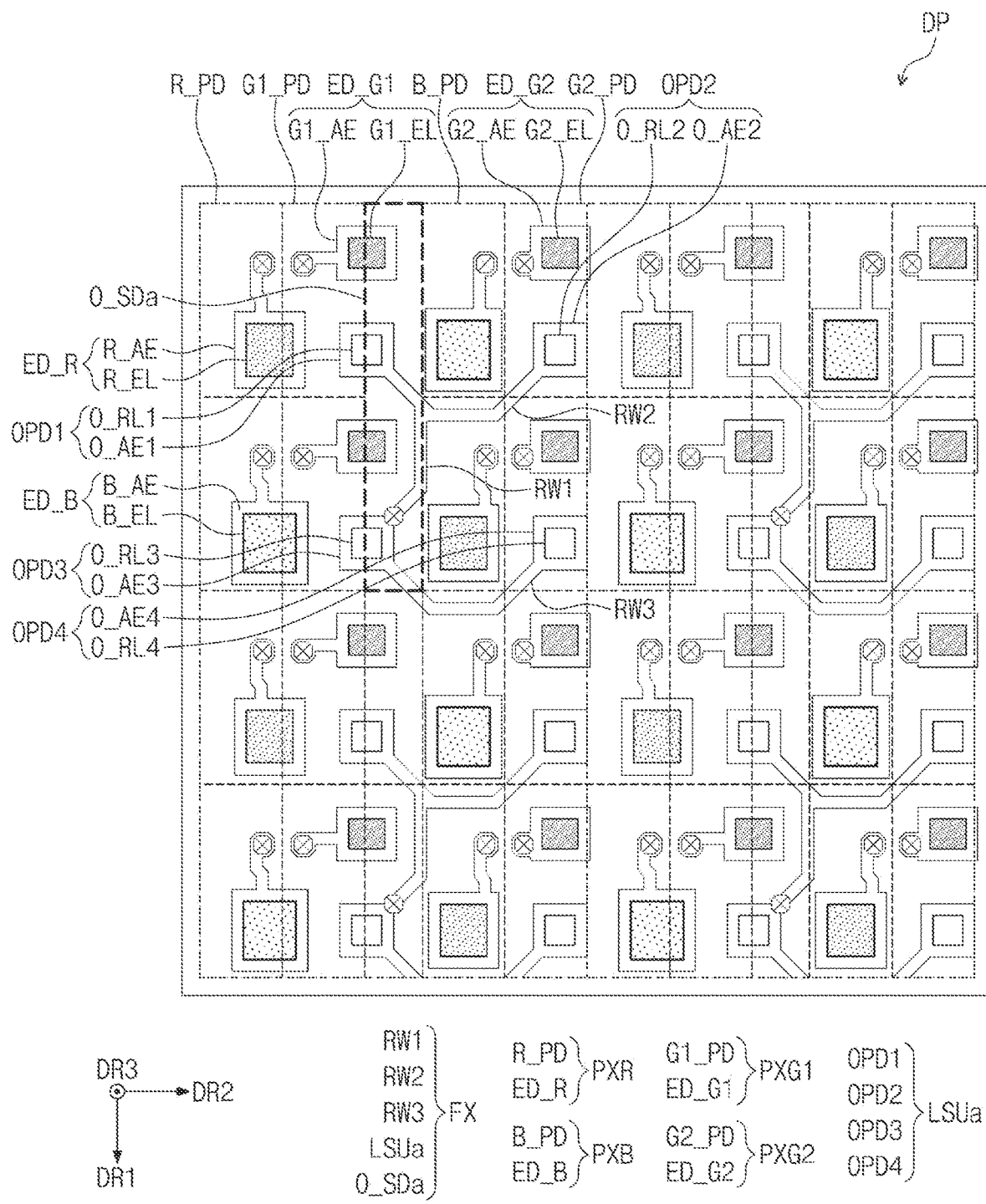
FIG. 4B is an enlarged plan view of a partial area of the display panel according to an embodiment of the present disclosure.

FIG. 4B is an enlarged plan view of a partial area of the display panel DP according to an embodiment of the present disclosure.

While the embodiment shown in FIG. 4A illustrates an example where k is 2, in the embodiment shown in FIG. 4B, k may be 4. When k is 4 as in FIG. 4B, a light sensing unit (e.g., one or more light sensing elements) LSUa may include four light sensing elements (hereinafter, referred to as the first to fourth light sensing elements OPD1, OPD2, OPD3, and OPD4). One of the first to fourth light sensing elements OPD1, OPD2, OPD3, and OPD4 (e.g., such as the third light sensing element OPD3) is connected to a sensor drive circuit O_SDa through a contact hole.

Each of the sensors FX may further include three routing lines (hereinafter, referred to as the first to third routing lines RW1, RW2, and RW3) that electrically connect the first to fourth light sensing elements OPD1, OPD2, OPD3, and OPD4 to one another. The first routing line RW1 electrically connects two light sensing elements (e.g., such as the first and third light sensing elements OPD1 and OPD3) that are adjacent to each other in the first direction DR1 from among the four light sensing elements OPD1, OPD2, OPD3, and OPD4 to each other. The second routing line RW2 electrically connects two light sensing elements (e.g., such as the first and second light sensing elements OPD1 and OPD2) that are adjacent to each other in the second direction DR2 from among the four light sensing elements OPD1, OPD2, OPD3, and OPD4 to each other. The third routing line RW3 electrically connects two light sensing elements (e.g., such as the third and fourth light sensing elements OPD3 and OPD4) that are adjacent to each other in the second direction DR2 from among the four light sensing elements OPD1, OPD2, OPD3, and OPD4 to each other.

The first light sensing element OPD1 includes a first anode O_AE1 and a first photoelectric conversion layer O_RL1, and the second light sensing element OPD2 includes a second anode O_AE2 and a second photoelectric conversion layer O_RL2. The third light sensing element OPD3 includes a third anode O_AE3 and a third photoelectric conversion layer O_RL3, and the fourth light sensing element OPD4 includes a fourth anode O_AE4 and a fourth photoelectric conversion layer O_RL4. The third anode O_AE3 is connected (e.g., directly connected) with the sensor drive circuit O_SDa through a contact hole. In the first direction DR1, the sensor drive circuit O_SDa may be longer than the red and blue pixel drive circuits R_PD and B_PD. Accordingly, the sensor drive circuit O_SDa may be disposed to overlap with two light sensing elements (e.g., such as the first and third light sensing elements OPD1 and OPD3) from among the first to fourth light sensing elements OPD1 to OPD4 on the plane (e.g., in a plan view). The sensor drive circuit O_SDa may overlap with two green light emitting elements (e.g., such as the first and second green light emitting elements ED_G1 and ED_G2) on the plane (e.g., in a plan view).

The first routing line RW1 is electrically connected to the first anode O_AE1 and the third anode O_AE3. The second routing line RW2 is electrically connected to the first anode O_AE1 and the second anode O_AE2. The third routing line RW3 is electrically connected to the third anode O_AE3 and the fourth anode O_AE4. In an embodiment of the present disclosure, the first to third routing lines RW1 to RW3 may be integrally formed with the first to fourth anodes O_AE1 to O_AE4.

The first to third routing lines RW1, RW2, and RW3 and the first to fourth anodes O_AE1 to O_AE4 may be disposed at (e.g., in or on) the same layer as that of the anodes R_AE, G1_AE, G2_AE, and B_AE. In this case, the first to third routing lines RW1, RW2, and RW3 and the first to fourth anodes O_AE1 to O_AE4 may contain the same material as that of the anodes R_AE, G1_AE, G2_AE, and B_AE, and may be provided through the same or substantially the same process.

The first to fourth light sensing elements OPD1, OPD2, OPD3, and OPD4 may be connected to the sensor drive circuit O_SDa in parallel with each other by the first to third routing lines RW1, RW2, and RW3. Accordingly, the first to fourth light sensing elements OPD1, OPD2, OPD3, and OPD4 may be concurrently (e.g., simultaneously or substantially simultaneously) turned on, or may be concurrently (e.g., simultaneously or substantially simultaneously) turned off, by the sensor drive circuit O_SDa.

Referring to FIGS. 4A and 4B, each of the sensor drive circuits O_SD and O_SDa may include a plurality of transistors. In an embodiment of the present disclosure, the sensor drive circuits O_SD and O_SDa and the pixel drive circuits R_PD, G1_PD, G2_PD, and B_PD may be concurrently (e.g., simultaneously or substantially simultaneously) formed through the same or substantially the same process. Furthermore, the scan driver 300 (e.g., refer to FIG. 3) may include transistors formed through the same or substantially the same process as those of the sensor drive circuits O_SD and O_SDa and the pixel drive circuits R_PD, G1_PD, G2_PD, and B_PD.

Figure 5:
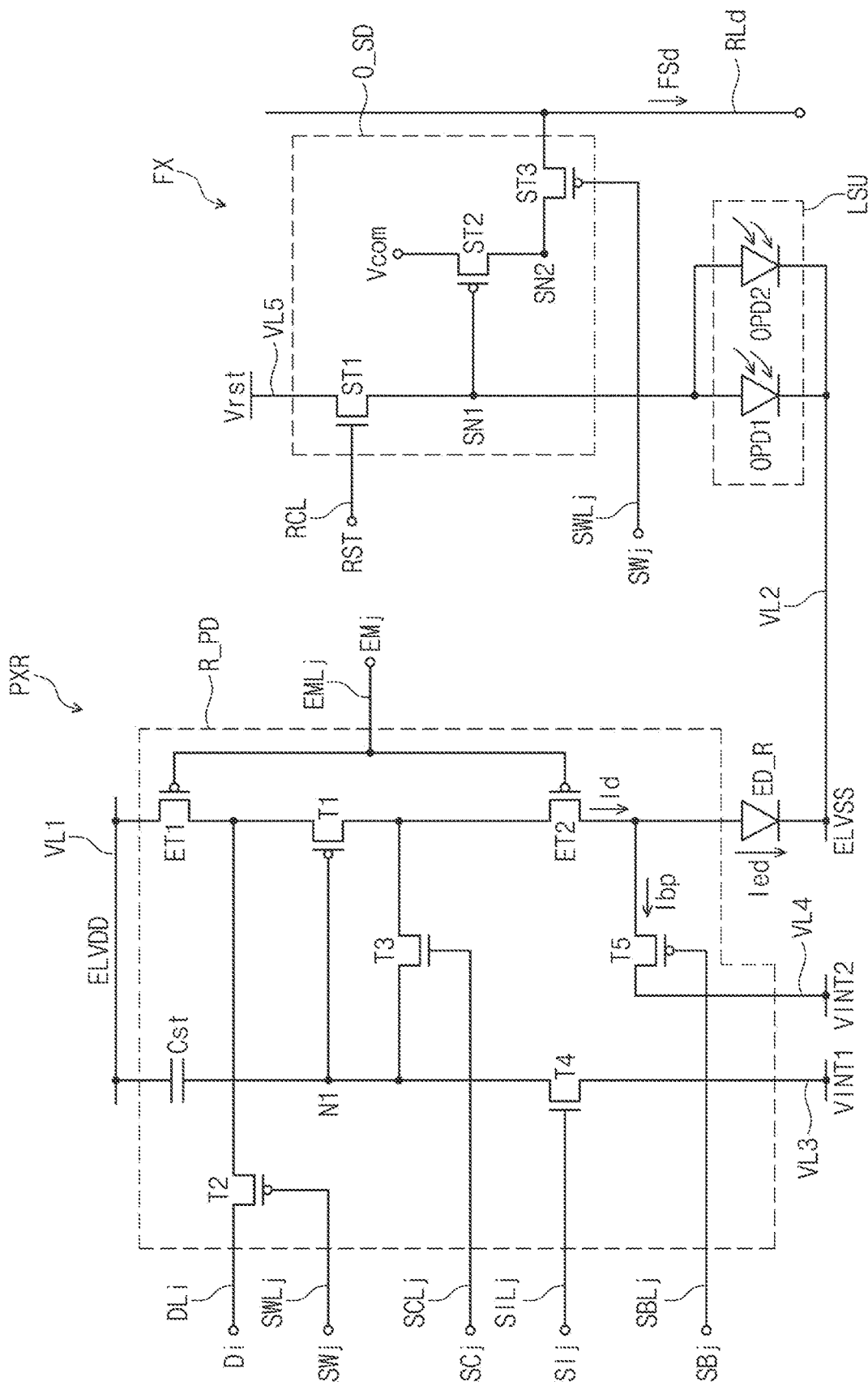
FIG. 5 is an equivalent circuit diagram of a pixel and a sensor according to an embodiment of the present disclosure.

FIG. 5 is an equivalent circuit diagram of the pixel PXR and the sensor FX according to an embodiment of the present disclosure.

FIG. 5 illustrates an equivalent circuit diagram of one pixel (e.g., the red pixel PXR) from among the plurality of pixels PX (e.g., refer to FIG. 3). Because the plurality of pixels PX have the same or substantially the same circuit structure as each other, the circuit structure for the red pixel PXR may be described in more detail hereinafter, and redundant description of the circuit structure for the other pixels may not be repeated. Furthermore, FIG. 5 illustrates an equivalent circuit diagram of one sensor FX from among the plurality of sensors FX (e.g., refer to FIG. 3). Because the plurality of sensors FX have the same or substantially the same circuit structure as each other, redundant description of the circuit structure for the other sensors FX may not be repeated.

Referring to FIGS. 3 and 5, the red pixel PXR is connected to an i-th data line DLi from among the data lines DL1 to DLm, a j-th initialization scan line SILj from among the initialization scan lines SIL1 to SILn, a j-th compensation scan line SCLj from among the compensation scan lines SCL1 to SCLn, a j-th write scan line SWLj from among the write scan lines SWL1 to SWLn, a j-th black scan line SBLj from among the black scan lines SBL1 to SBLn, and a j-th light emission control line EMLj from among the light emission control lines EML1 to EMLn.

The red pixel PXR includes the red light emitting element ED_R and the red pixel drive circuit R_PD. The red light emitting element ED_R may be a light emitting diode. In an embodiment of the present disclosure, the red light emitting element ED_R may be an organic light emitting diode including an organic light emitting layer.

The red pixel drive circuit R_PD includes first to fifth transistors T1, T2, T3, T4, and T5, first and second light emission control transistors ET1 and ET2, and a capacitor Cst.

At least one from among the first to fifth transistors T1, T2, T3, T4, and T5 and the first and second light emission control transistors ET1 and ET2 may be a transistor having a low-temperature polycrystalline silicon (LTPS) semiconductor layer. At least one from among the first to fifth transistors T1, T2, T3, T4, and T5 and the first and second light emission control transistors ET1 and ET2 may be a transistor having an oxide semiconductor layer. For example, the third and fourth transistors T3 and T4 may be oxide semiconductor transistors, and the first, second, and fifth transistors T1, T2, and T5 and the first and second light emission control transistors ET1 and ET2 may be LTPS transistors.

In more detail, the first transistor T1 may directly affect the brightness of the display device DD (e.g., refer to FIG. 1), and thus, may include a semiconductor layer formed of polycrystalline silicon having high reliability. Accordingly, the display device DD having a high resolution may be implemented. On the other hand, an oxide semiconductor has high carrier mobility and low leakage current, and therefore, a voltage drop may not be great even though an operating time is long. In other words, the color of an image may not be greatly changed depending on a voltage drop even during low-frequency operation, and therefore, low-frequency operation may be possible. Because the oxide semiconductor has low leakage current as described above, at least one of the third transistor T3, which is connected with a drive gate electrode of the first transistor T1, and the fourth transistor T4 may be employed as an oxide semiconductor to reduce power consumption, while preventing or substantially preventing a leakage current that may flow to the drive gate electrode.

Some of the first to fifth transistors T1, T2, T3, T4, and T5 and the first and second light emission control transistors ET1 and ET2 may be P-type transistors, and the others thereof may be N-type transistors. For example, the first, second, and fifth transistors T1, T2, and T5 and the first and second light emission control transistors ET1 and ET2 may be P-type transistors, and the third and fourth transistors T3 and T4 may be N-type transistors.

The configuration of the red pixel drive circuit R_PD is not limited to the embodiment illustrated in FIG. 5. The red pixel drive circuit R_PD illustrated in FIG. 5 is illustrated as an example, and various suitable modifications may be made to the configuration of the red pixel drive circuit R_PD as needed or desired. For example, the first to fifth transistors T1, T2, T3, T4, and T5 and the first and second light emission control transistors ET1 and ET2 may all be P-type transistors or N-type transistors.

The j-th initialization scan line SILj, the j-th compensation scan line SCLj, the j-th write scan line SWLj, the j-th black scan line SBLj, and the j-th light emission control line EMLj may transfer the j-th initialization scan signal SIj, the j-th compensation scan signal SCj, the j-th write scan signal SWj, the j-th black scan signal SBj, and the j-th light emission control signal EMj to the red pixel PXR, respectively. The i-th data line DLi transfers the i-th data signal Di to the red pixel PXR. The i-th data signal Di may have a voltage level corresponding to the image signal RGB that is input to the display device DD (e.g., refer to FIG. 3).

First and second drive voltage lines VL1 and VL2 may transfer the first drive voltage ELVDD and the second drive voltage ELVSS to the red pixel PXR, respectively. Furthermore, first and second initialization voltage lines VL3 and VL4 may transfer the first initialization voltage VINT1 and the second initialization voltage VINT2 to the red pixel PXR, respectively.

The first transistor T1 is connected between the first drive voltage line VL1 for receiving the first drive voltage ELVDD and the red light emitting element ED_R. The first transistor T1 includes a first electrode connected with the first drive voltage line VL1 via the first light emission control transistor ET1, a second electrode connected with the red anode R_AE (e.g., refer to FIG. 4A) of the red light emitting element ED_R via the second light emission control transistor ET2, and a third electrode (e.g., a gate electrode) connected with one end of the capacitor Cst (e.g., at a first node N1). The first transistor T1 may receive the i-th data signal Di that the i-th data line DLi transfers depending on a switching operation of the second transistor T2, and may supply a drive current Id to the red light emitting element ED_R.

The second transistor T2 is connected between the i-th data line DLi and the first electrode of the first transistor T1. The second transistor T2 includes a first electrode connected with the i-th data line DLi, a second electrode connected with the first electrode of the first transistor T1, and a third electrode (e.g., a gate electrode) connected with the j-th write scan line SWLj. The second transistor T2 may be turned on in response to the j-th write scan signal SWj transferred through the j-th write scan line SWLj, and may transfer, to the first electrode of the first transistor T1, the i-th data signal Di transferred from the i-th data line DLi.

The third transistor T3 is connected between the second electrode of the first transistor T1 and the first node N1. The third transistor T3 includes a first electrode connected with the third electrode of the first transistor T1, a second electrode connected with the second electrode of the first transistor T1, and a third electrode (e.g., a gate electrode) connected with the j-th compensation scan line SCLj. The third transistor T3 may be turned on in response to the j-th compensation scan signal SCj transferred through the j-th compensation scan line SCLj, and may diode-connect the first transistor T1 by connecting the third electrode and the second electrode of the first transistor T1 to each other.

The fourth transistor T4 is connected between the first initialization voltage line VL3 to which the first initialization voltage VINT1 is applied and the first node N1. The fourth transistor T4 includes a first electrode connected with the first initialization voltage line VL3 through which the first initialization voltage VINT1 is transferred, a second electrode connected with the first node N1, and a third electrode (e.g., a gate electrode) connected with the j-th initialization scan line SILj. The fourth transistor T4 is turned on in response to the j-th initialization scan signal SIj transferred through the j-th initialization scan line SILj. The turned-on fourth transistor T4 initializes a potential of the third electrode of the first transistor T1 (or in other words, the potential of the first node N1) by transferring the first initialization voltage VINT1 to the first node N1.

The first light emission control transistor ET1 includes a first electrode connected with the first drive voltage line VL1, a second electrode connected with the first electrode of the first transistor T1, and a third electrode (e.g., a gate electrode) connected to the j-th light emission control line EMLj.

The second light emission control transistor ET2 includes a first electrode connected with the second electrode of the first transistor T1, a second electrode connected to the red anode R_AE of the red light emitting element ED_R (e.g., refer to FIG. 4A), and a third electrode (e.g., a gate electrode) connected to the j-th light emission control line EMLj.

The first and second light emission control transistors ET1 and ET2 are concurrently (e.g., simultaneously or substantially simultaneously) turned on in response to the j-th light emission control signal EMj transferred through the j-th light emission control line EMLj. The first drive voltage ELVDD applied through the turned-on first light emission control transistor ET1 may be compensated for through the diode-connected first transistor T1, and thereafter, may be transferred to the red light emitting element ED_R.

The fifth transistor T5 includes a first electrode connected to the second initialization voltage line VL4 through which the second initialization voltage VINT2 is transferred, a second electrode connected with the second electrode of the second light emission control transistor ET2, and a third electrode (e.g., a gate electrode) connected with the j-th black scan line SBLj. The second initialization voltage VINT2 may have a voltage level lower than or equal to the voltage level of the first initialization voltage VINT1. In an embodiment of the present disclosure, each of the first and second initialization voltages VINT1 and VINT2 may have a voltage of −3.5V.

The one end of the capacitor Cst is connected with the third electrode of the first transistor T1 as described above, and an opposite end of the capacitor Cst is connected with the first drive voltage line VL1. A cathode of the red light emitting element ED_R may be connected with the second drive voltage line VL2 that transfers the second drive voltage ELVSS. The second drive voltage ELVSS may have a lower voltage level than that of the first drive voltage ELVDD. In an embodiment of the present disclosure, the first drive voltage ELVDD may be 4.6 V, and the second drive voltage ELVSS may be −2.5V.

The sensor FX is connected to a d-th readout line RLd from among the readout lines RL1 to RLh, the j-th write scan line SWLj, and a reset control line RCL.

The sensor FX includes the light sensing unit LSU and the sensor drive circuit O_SD. The light sensing unit LSU may include the k light sensing elements connected in parallel with each other. When k is 2, the first and second light sensing elements OPD1 and OPD2 may be connected with each other in parallel. Each of the first and second light sensing elements OPD1 and OPD2 may be a photodiode. In an embodiment of the present disclosure, each of the first and second light sensing elements OPD1 and OPD2 may be an organic photodiode that contains an organic material as a photoelectric conversion layer. The first and second anodes O_AE1 and O_AE2 (e.g., refer to FIG. 4A) of the first and second light sensing elements OPD1 and OPD2 may be connected to a first sensing node SN1, and first and second cathodes of the first and second light sensing elements OPD1 and OPD2 may be connected with the second drive voltage line VL2 that transfers the second drive voltage ELVSS. When k is 4, the first to fourth light sensing elements OPD1 to OPD4 (e.g., refer to FIG. 4B) may be connected in parallel.

The sensor drive circuit O_SD includes three transistors ST1, ST2, and ST3. The three transistors ST1, ST2, and ST3 may include a reset transistor ST1, an amplifying transistor ST2, and an output transistor ST3. At least one of the reset transistor ST1, the amplifying transistor ST2, and the output transistor ST3 may be an oxide semiconductor transistor. In an embodiment of the present disclosure, the reset transistor ST1 may be an oxide semiconductor transistor, and the amplifying transistor ST2 and the output transistor ST3 may be LTPS transistors. However, without being limited thereto, at least the reset transistor ST1 and the output transistor ST3 may be oxide semiconductor transistors, and the amplifying transistor ST2 may be an LTPS transistor.

Furthermore, some of the reset transistor ST1, the amplifying transistor ST2, and the output transistor ST3 may be P-type transistors, and the rest thereof may be N-type transistors. In an embodiment of the present disclosure, the amplifying transistor ST2 and the output transistor ST3 may be P-type transistors, and the reset transistor ST1 may be an N-type transistor. However, without being limited thereto, the reset transistor ST1, the amplifying transistor ST2, and the output transistor ST3 may all be N-type transistors or P-type transistors.

A circuit configuration of the sensor drive circuit O_SD is not limited to that of the sensor drive circuit O_SD illustrated in FIG. 5. The sensor drive circuit O_SD illustrated in FIG. 5 is provided as an example, and various suitable modifications may be made to the configuration of the sensor drive circuit O_SD as needed or desired.

The reset transistor ST1 includes a first electrode that is connected to a third initialization voltage line VL5 and that receives the reset voltage Vrst, a second electrode connected with the first sensing node SN1, and a third electrode (e.g., a gate electrode) that receives a reset control signal RST. The reset transistor ST1 may reset a potential of the first sensing node SN1 to the reset voltage Vrst in response to the reset control signal RST. The reset control signal RST may be a signal provided through the reset control line RCL. However, the present disclosure is not limited thereto. In other embodiments, the reset control signal RST may be the j-th compensation scan signal SCj supplied through the j-th compensation scan line SCLj. In other words, the reset transistor ST1 may receive the j-th compensation scan signal SCj, which is supplied from the j-th compensation scan line SCLj, as the reset control signal RST. In an embodiment of the present disclosure, the reset voltage Vrst may have a lower voltage level than that of the second drive voltage ELVSS, at least during an activation period of the reset control signal RST. The reset voltage Vrst may be a DC voltage that is maintained or substantially maintained at a lower voltage level than that of the second drive voltage ELVSS. For example, the reset voltage Vrst may be −4.5V.

The amplifying transistor ST2 includes a first electrode that receives a sensing drive voltage Vcom, a second electrode connected with a second sensing node SN2, and a third electrode (e.g., a gate electrode) connected with the first sensing node SN1. The amplifying transistor ST2 may be turned on depending on the potential of the first sensing node SN1, and may apply the sensing drive voltage Vcom to the second sensing node SN2. In an embodiment of the present disclosure, the sensing drive voltage Vcom may be one of the first drive voltage ELVDD, the first initialization voltage VINT1, or the second initialization voltage VINT2. When the sensing drive voltage Vcom is the first drive voltage ELVDD, the first electrode of the amplifying transistor ST2 may be electrically connected to the first drive voltage line VL1. When the sensing drive voltage Vcom is the first initialization voltage VINT1, the first electrode of the amplifying transistor ST2 may be electrically connected to the first initialization voltage line VL3. When the sensing drive voltage Vcom is the second initialization voltage VINT2, the first electrode of the amplifying transistor ST2 may be electrically connected to the second initialization voltage line VL4.

The output transistor ST3 includes a first electrode connected with the second sensing node SN2, a second electrode connected with the d-th readout line RLd, and a third electrode (e.g., a gate electrode) that receives an output control signal. In response to the output control signal, the output transistor ST3 may transfer a sensing signal FSd to the d-th readout line RLd. The output control signal may be the j-th write scan signal SWj supplied through the j-th write scan line SWLj. In other words, the output transistor ST3 may receive the j-th write scan signal SWj, which is supplied from the j-th write scan line SWLj, as the output control signal.

The light sensing unit LSU of the sensor FX may be exposed to light during light emission periods of the light emitting elements ED_R, ED_G1, ED_G2, and ED_B. The light may be output from one of the light emitting elements ED_R, ED_G1, ED_G2, and ED_B.

When the user's hand US_F (e.g., refer to FIG. 1) touches (e.g., contacts) the display surface IS (e.g., see FIG. 1), the first and second light sensing elements OPD1 and OPD2 may generate photo-charges corresponding to light reflected by ridges of a fingerprint and/or valleys between the ridges, and the generated photo-charges may be accumulated in the first sensing node SN1.

The amplifying transistor ST2 may be a source follower amplifier that generates a source-drain current in proportion to the amount of charge of the first sensing node SN1 that is input to the third electrode of the amplifying transistor ST2.

The j-th write scan signal SWj having a low level is supplied to the output transistor ST3 through the j-th write scan line SWLj. When the output transistor ST3 is turned on in response to the j-th write scan signal SWj having the low level, the sensing signal FSd corresponding to a current flowing through the amplifying transistor ST2 may be output to the d-th readout line RLd.

When the reset control signal RST having a high level is supplied through the reset control line RCL, the reset transistor ST1 is turned on. A reset period may be defined as an activation period (e.g., a high-level period) of the reset control line RCL. As another example, when the reset transistor ST1 is implemented with a PMOS transistor, the reset control signal RST having a low level may be supplied to the reset control line RCL during the reset period. During the reset period, the first sensing node SN1 may be reset to a potential corresponding to the reset voltage Vrst. In an embodiment of the present disclosure, the reset voltage Vrst may have a lower voltage level than that of the second drive voltage ELVSS.

When the reset period ends, the light sensing unit LSU may generate photo-charges corresponding to received light, and the generated photo-charges may be accumulated in the first sensing node SN1.

Figure 6:
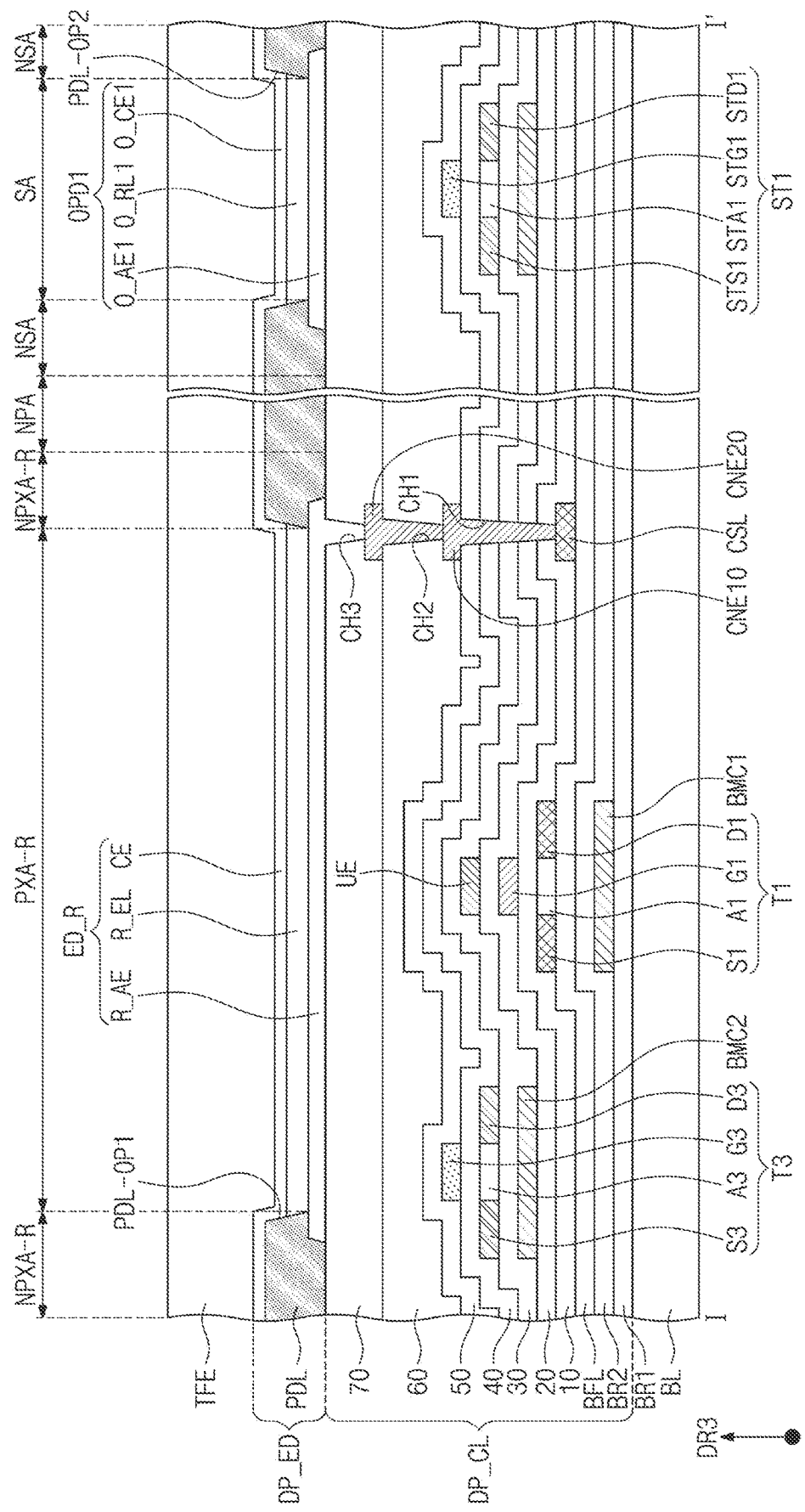
FIG. 6 is a cross-sectional view of the display panel according to an embodiment of the present disclosure.

FIG. 6 is a cross-sectional view of the display panel DP according to an embodiment of the present disclosure. For example, the cross-section illustrated in FIG. 6 may correspond to a cross-section taken along the line I-I' illustrated in FIG. 4A.

Referring to FIGS. 4A and 6, the display panel DP may include the base layer BL, and the circuit layer DP_CL, the element layer DP_ED, and the encapsulation layer TFE that are disposed on the base layer BL.

The base layer BL may include a synthetic resin layer. The synthetic resin layer may contain a thermosetting resin. For example, the synthetic resin layer may include (e.g., may be) a polyimide-based resin layer, but the material thereof is not particularly limited. The synthetic resin layer may include at least one of an acrylate-based resin, a methacrylate-based resin, a polyisoprene-based resin, a vinyl-based resin, an epoxy-based resin, a urethane-based resin, a celluose-based resin, a siloxane-based resin, a polyamide-based resin, and a perylene-based resin. In addition, the base layer BL may include a glass substrate, a metal substrate, or an organic/inorganic composite substrate.

At least one inorganic layer is formed on an upper surface of the base layer BL. The inorganic layer may include at least one of aluminum oxide, titanium oxide, silicon oxide, silicon oxy-nitride, zirconium oxide, and hafnium oxide. The inorganic layer may be formed in multiple layers. The multiple inorganic layers may constitute barrier layers BR1 and BR2, and/or a buffer layer BFL, which will be described in more detail below. The barrier layers BR1 and BR2 and the buffer layer BF may be selectively disposed as needed or desired.

The barrier layers BR1 and BR2 prevent or substantially prevent infiltration of foreign matter from the outside. The barrier layers BR1 and BR2 may include a silicon oxide layer and a silicon nitride layer. A plurality of silicon oxide layers and a plurality of silicon nitride layers may be provided. The silicon oxide layers and the silicon nitride layers may be alternately stacked one above another.

The barrier layers BR1 and BR2 may include a first barrier layer BR1 and a second barrier layer BR2. A first back metal layer BMC1 may be disposed between the first barrier layer BR1 and the second barrier layer BR2. In an embodiment of the present disclosure, the first back metal layer BMC1 may be omitted as needed or desired.

The buffer layer BFL may be disposed on the barrier layers BR1 and BR2. The buffer layer BFL may improve a coupling force between the base layer BL and a semiconductor pattern and/or a conductive pattern. The buffer layer BFL may include silicon oxide layers and silicon nitride layers. The silicon oxide layers and the silicon nitride layers may be alternately stacked one above another.

A first semiconductor pattern may be disposed on the buffer layer BFL. The first semiconductor pattern may include a silicon semiconductor. For example, the silicon semiconductor may contain amorphous silicon or polycrystalline silicon. For example, the first semiconductor pattern may contain a low-temperature poly silicon.

FIG. 6 illustrates a portion (e.g., only a portion) of the first semiconductor pattern that is disposed on the buffer layer BFL, and the first semiconductor pattern may be additionally disposed at (e.g., in or on) another area. The first semiconductor pattern may be arranged across the pixels according to a desired rule (e.g., a predetermined or specific rule). The first semiconductor pattern may have different electrical properties depending on whether or not the first semiconductor pattern is doped. The first semiconductor pattern may include a first area having a high conductivity, and a second area having a low conductivity. The first area may be doped with an N-type dopant or a P-type dopant. A P-type transistor may include a doped area doped with a P-type dopant, and an N-type transistor may include a doped area doped with an N-type dopant. The second area may be an undoped area, or may be an area that is more lightly doped than that of the first area.

The first area may have a higher conductivity than that of the second area, and may serve or substantially serve as an electrode or a signal line. The second area may correspond to or substantially correspond to an active area (e.g., a channel) of a transistor. In other words, one portion of the first semiconductor pattern may be an active area of a transistor, another portion may be a source or drain of the transistor, and another portion may be a connecting electrode or a connecting signal line.

A first electrode S1, a channel part A1, and a second electrode D1 of the first transistor T1 are formed from the first semiconductor pattern. The first electrode S1 and the second electrode D1 of the first transistor T1 extend from the channel part A1 in opposite directions from each other.

In FIG. 6, a portion of a connecting signal line CSL that is formed from the first semiconductor pattern is illustrated. The connecting signal line CSL may be connected to the second electrode of the fifth transistor T5 (e.g., refer to FIG. 5) on the plane (e.g., in a plan view).

A first insulating layer 10 may be disposed on the buffer layer BFL. The first insulating layer 10 may commonly overlap with the plurality of pixels, and may cover the first semiconductor pattern. The first insulating layer 10 may be an inorganic layer and/or an organic layer, and may have a single-layer structure or a multi-layered structure. The first insulating layer 10 may include at least one of aluminum oxide, titanium oxide, silicon oxide, silicon nitride, silicon oxy-nitride, zirconium oxide, and hafnium oxide. In the present embodiment, the first insulating layer 10 may be a single silicon oxide layer. Similar to the first insulating layer 10, insulating layers of the circuit layer DP_CL described in more detail below may be inorganic layers and/or organic layers, and may have a single-layer structure or a multi-layered structure. The inorganic layers may include at least one of the aforementioned materials, but the present disclosure is not limited thereto.

The third electrode G1 of the first transistor T1 is disposed on the first insulating layer 10. The third electrode G1 may be a portion of a metal pattern. The third electrode G1 of the first transistor T1 overlaps with the channel part A1 of the first transistor T1. The third electrode G1 of the first transistor T1 may function as a mask in a process of doping the first semiconductor pattern. The third electrode G1 may include titanium (Ti), silver (Ag), an alloy containing silver, molybdenum (Mo), an alloy containing molybdenum, aluminum (Al), an alloy containing aluminum, aluminum nitride (AlN), tungsten (W), tungsten nitride (WN), copper (Cu), indium tin oxide (ITO), or indium zinc oxide (IZO), but is not particularly limited thereto.

A second insulating layer 20 may be disposed on the first insulating layer 10, and may cover the third electrode G1 of the first transistor T1. The second insulating layer 20 may be an inorganic layer and/or an organic layer, and may have a single-layer structure or a multi-layered structure. The second insulating layer 20 may include at least one of silicon oxide, silicon nitride, and silicon oxy-nitride. In the present embodiment, the second insulating layer 20 may have a multi-layered structure including a silicon oxide layer and a silicon nitride layer.

An upper electrode UE and a second back metal layer BMC2 may be disposed on the second insulating layer 20. The upper electrode UE may overlap with the third electrode G1. The upper electrode UE may be a portion of a metal pattern. A portion of the third electrode G1 and the upper electrode UE overlapping with the portion of the third electrode G1 may define the capacitor Cst (e.g., refer to FIG. 5). In an embodiment of the present disclosure, the second insulating layer 20 may be replaced with an insulating pattern. In this case, the upper electrode UE may be disposed on the insulating pattern. The upper electrode UE may serve as a mask when forming the insulating pattern.

The second back metal layer BMC2 may be disposed under (e.g., underneath) an oxide thin film transistor, for example, such as the third transistor T3, to correspond to the oxide thin film transistor (e.g., the third transistor T3). A constant or substantially constant voltage or a signal may be applied to the second back metal layer BMC2.

A third insulating layer 30 may be disposed on the second insulating layer 20, and may cover the upper electrode UE and the second back metal layer BMC2. The third insulating layer 30 may have a single-layer structure or a multi-layered structure. For example, the third insulating layer 30 may have a multi-layered structure including a silicon oxide layer and a silicon nitride layer.

A second semiconductor pattern may be disposed on the third insulating layer 30. The second semiconductor pattern may include an oxide semiconductor. The oxide semiconductor may include a plurality of areas distinguished from one another depending on whether or not a metal oxide is reduced. An area where the metal oxide is reduced (hereinafter, referred to as the reduced area) has a higher conductivity than that of an area where the metal oxide is not reduced (hereinafter, referred to as the non-reduced area). The reduced area serves or substantially serves as a source/drain of a transistor or a signal line. The non-reduced area may correspond to or substantially correspond to an active area (e.g., a semiconductor area or a channel) of the transistor. In other words, one portion of the second semiconductor pattern may be an active area of a transistor, another portion may be a source/drain area of the transistor, and another portion may be a signal transmission area.

A first electrode S3, a channel part A3, and a second electrode D3 of the third transistor T3 are formed from the second semiconductor pattern. The first electrode S3 and the second electrode D3 contain a metal reduced from a metal oxide semiconductor. The first electrode S3 and the second electrode D3 may extend from the channel part A3 in opposite directions from each other.

A fourth insulating layer 40 may be disposed on the third insulating layer 30. The fourth insulating layer 40 may commonly overlap with the plurality of pixels, and may cover the second semiconductor pattern. The fourth insulating layer 40 may include at least one of aluminum oxide, titanium oxide, silicon oxide, silicon nitride, silicon oxynitride, zirconium oxide, and hafnium oxide.

The third electrode G3 of the third transistor T3 is disposed on the fourth insulating layer 40. The third electrode G3 may be a portion of a metal pattern. The third electrode G3 of the third transistor T3 overlaps with the channel part A3 of the third transistor T3. The third electrode G3 may function as a mask in a process of doping the second semiconductor pattern. In an embodiment of the present disclosure, the fourth insulating layer 40 may be replaced with an insulating pattern.

A fifth insulating layer 50 may be disposed on the fourth insulating layer 40, and may cover the third electrode G3. The fifth insulating layer 50 may be an inorganic layer.

A first connecting electrode CNE10 may be disposed on the fifth insulating layer 50. The first connecting electrode CNE10 may be connected to the connecting signal line CSL through a first contact hole CH1 penetrating the first to fifth insulating layers 10, 20, 30, 40, and 50.

A sixth insulating layer 60 may be disposed on the fifth insulating layer 50. The sixth insulating layer 60 may be an organic layer. The organic layer may include, but is not particularly limited to, a general purpose polymer, such as benzocyclobutene (BCB), polyimide, hexamethyldisiloxane (HMDSO), Polymethylmethacrylate (PMMA), or Polystyrene (PS), a polymer derivative having a phenolic group, an acrylate-based polymer, an imide-based polymer, an aryl ether-based polymer, an amide-based polymer, a fluorine-based polymer, a p-xylene-based polymer, a vinyl alcohol-based polymer, or a suitable blend thereof.

A second connecting electrode CNE20 may be disposed on the sixth insulating layer 60. The second connecting electrode CNE20 may be connected to the first connecting electrode CNE10 through a second contact hole CH2 penetrating the sixth insulating layer 60. A seventh insulating layer 70 may be disposed on the sixth insulating layer 60, and may cover the second connecting electrode CNE20. The seventh insulating layer 70 may be an organic layer.

A first electrode layer is disposed on the circuit layer DP_CL. A pixel defining film PDL is formed on the first electrode layer. The first electrode layer may include the red anode R_AE, the green anodes G1_AE and G2_AE, the blue anode B_AE and the first anode O_AE1. The red anode R_AE, the green anodes G1_AE and G2_AE, the blue anode B_AE and the first anode O_AE1 are disposed on the seventh insulating layer 70. The red anode R_AE may be connected with the second connecting electrode CNE20 through a third contact hole CH3 penetrating the seventh insulating layer 70.

The pixel defining film PDL has first and second film openings PDL-OP1 and PDL-OP2. The first film openings PDL-OP1 expose at least a portion of the red anode R_AE, at least a portion of each of the green anodes G1_AE and G2_AE, and at least a portion of the blue anode B_AE, respectively. The second film opening PDL-OP2 exposes at least a portion of the first anode O_AE1.

In an embodiment of the present disclosure, the pixel defining film PDL may additionally contain a black material. The pixel defining film PDL may additionally contain a black organic dye/pigment, such as carbon black, aniline black, or the like. The pixel defining film PDL may be formed by mixing a blue organic material and a black organic material with each other. The pixel defining film PDL may additionally contain a liquid-repellent organic material.

As illustrated in FIG. 6, the display panel DP may include a second emissive area PXA-R, and a non-emissive area NPXA-R adjacent to the second emissive area PXA-R. The display panel DP may further include a green emissive area and a blue emissive area that overlap with the green anodes G1_AE and G2_AE and the blue anode B_AE. The non-emissive area NPXA-R may surround (e.g., around a periphery of) the second emissive area PXA-R. In the present embodiment, the second emissive area PXA-R is defined to correspond to a partial area of the red anode R_AE that is exposed by the first film opening PDL-OP1.

A light emitting layer may be disposed on the first electrode layer. The light emitting layer may include the red, green, and blue light emitting layers R_EL, G1_EL, G2_EL, and B_EL. The red, green, and blue light emitting layers R_EL, G1_EL, G2_EL, and B_EL may be disposed in areas corresponding to the first film openings PDL-OP1. The red, green, and blue light emitting layers R_EL, G1_EL, G2_EL, and B_EL may be separately formed in the red, green, and blue pixels PXR, PXG1, PXG2, and PXB, respectively. Each of the red, green, and blue light emitting layers R_EL, G1_EL, G2_EL, and B_EL may contain an organic material and/or an inorganic material. The red, green, and blue light emitting layers R_EL, G1_EL, G2_EL, and B_EL may generate light beams having suitable colors (e.g., predetermined colors). For example, the red light emitting layer R_EL may generate red light, the green light emitting layers G1_EL and G2_EL may generate green light, and the blue light emitting layer B_EL may generate blue light.

Although patterned red, green, and blue light emitting layers R_EL, G1_EL, G2_EL, and B_EL have been described, the present disclosure is not limited thereto, and one light emitting layer may be commonly disposed in a plurality of emissive areas. In this case, the light emitting layer may generate white light or blue light. Furthermore, the light emitting layer may have a multi-layered structure, also referred to as a tandem structure.

Each of the red, green, and blue light emitting layers R_EL, G1_EL, G2_EL, and B_EL may contain a low-molecular weight organic material, or a high-molecular weight organic material, as a luminescent material. As another example, each of the red, green, and blue light emitting layers R_EL, G1_EL, G2_EL, and B_EL may contain a quantum-dot material as a luminescent material. A core of a quantum dot may be selected from Group II-VI compounds, Group III-V compounds, Group IV-VI compounds, Group IV elements, Group IV compounds, and/or suitable combinations thereof.

A cathode CE is disposed on the red, green, and blue light emitting layers R_EL, G1_EL, G2_EL, and B_EL. In an embodiment of the present disclosure, the cathode CE may be commonly disposed at (e.g., in or on) the emissive areas PXA-R, PXA-G, and PXA-B, the non-emissive area NPXA-R, and the non-pixel area NPA.

The circuit layer DP_CL may further include the sensor drive circuit O_SD (e.g., refer to FIG. 5). For convenience of illustration, the reset transistor ST1 of the sensor drive circuit O_SD is illustrated. A first electrode STS1, a channel part STA1, and a second electrode STD1 of the reset transistor ST1 are formed from the second semiconductor pattern. The first electrode STS1 and the second electrode STD1 include a metal reduced from a metal oxide semiconductor. The fourth insulating layer 40 is disposed to cover the first electrode STS1, the channel part STA1, and the second electrode STD1 of the reset transistor ST1. The third electrode STG1 of the reset transistor ST1 is disposed on the fourth insulating layer 40. In the present embodiment, the third electrode STG1 may be a portion of a metal pattern. The third electrode STG1 of the reset transistor ST1 overlaps with the channel part STA1 of the reset transistor ST1.

In an embodiment of the present disclosure, the reset transistor ST1 may be disposed at (e.g., in or on) the same layer as that of the third transistor T3. In other words, the first electrode STS1, the channel part STA1, and the second electrode STD1 of the reset transistor ST1 may be formed through the same process as those of the first electrode S3, the channel part A3, and the second electrode D3 of the third transistor T3. The third electrode STG1 of the reset transistor ST1 and the third electrode G3 of the third transistor T3 may be concurrently (e.g., simultaneously or substantially simultaneously) formed through the same process. the first electrodes and the second electrodes of the amplifying transistor ST2 and the output transistor ST3 of the sensor drive circuit O_SD may be formed through the same process as those of the first electrode S1 and the second electrode D1 of the first transistor T1. The reset transistor ST1 and the third transistor T3 may be formed at (e.g., in or on) the same layer as each other through the same process, and thus, an additional process for forming the reset transistor ST1 may not be needed. Accordingly, a process efficiency may be improved, and cost savings may be achieved.

The element layer DP_ED may further include the first and second light sensing elements OPD1 and OPD2 (e.g., refer to FIG. 5). For convenience of illustration, the first light sensing element OPD1 is illustrated in FIG. 6.

The first light sensing element OPD1 may include the first anode O_AE1, a first photoelectric conversion layer O_RL1, and a first cathode O_CE1. The first anode O_AE1 may be disposed at (e.g., in or on) the same layer as that of the first electrode layer. In other words, the first anode O_AE1 may be disposed on the circuit layer DP_CL, and may be concurrently (e.g., simultaneously or substantially simultaneously) formed with the red anode R_AE, the green anodes G1_AE and G2_AE, and the blue anode B_AE through the same process.

The second film opening PDL-OP2 of the pixel defining film PDL exposes at least a portion of the first anode O_AE1. The first photoelectric conversion layer O_RL1 is disposed on the first anode O_AE1 exposed by the second film opening PDL-OP2. The first photoelectric conversion layer O_RL1 may contain an organic photo sensing material. The first cathode O_CE1 may be disposed on the first photoelectric conversion layer O_RL1. The first cathode O_CE1 may be concurrently (e.g., simultaneously or substantially simultaneously formed) with the cathode CE through the same process. In an embodiment of the present disclosure, the first cathode O_CE1 may be integrally formed with the cathode CE.

The first anode O_AE1 and the first cathode O_CE1 may each receive an electrical signal. The first cathode O_CE1 may receive a different signal from that of the first anode O_AE1. Accordingly, a desired electric field (e.g., a predetermined electric field) may be formed between the first anode O_AE1 and the first cathode O_CE1. The first photoelectric conversion layer O_RL1 generates an electrical signal corresponding to light incident on the sensor. The first photoelectric conversion layer O_RL1 may generate charges by absorbing energy of the incident light. For example, the first photoelectric conversion layer O_RL1 may contain a photosensitive semiconductor material.

The charges generated by the first photoelectric conversion layer O_RL1 may change the electric field between the first anode O_AE1 and the first cathode O_CE1. The amount of charges generated in the first photoelectric conversion layer O_RL1 may vary depending on whether or not light is incident on the first light sensing element OPD1, and the amount and intensity of the light incident on the first light sensing element OPD1. Accordingly, the electric field formed between the first anode O_AE1 and the first cathode O_CE1 may vary. The first light sensing element OPD1 according to one or more embodiments of the present disclosure may obtain fingerprint information of the user through the change in the electric field between the first anode O_AE1 and the first cathode O_CE1.

However, the present disclosure is not limited thereto, and the first light sensing element OPD1 may include a phototransistor with the first photoelectric conversion layer O_RL1 as an active layer. In this case, the first light sensing element OPD1 may obtain fingerprint information by sensing the amount of current flowing through the phototransistor. The first light sensing element OPD1 according to an embodiment of the present disclosure may include various suitable photoelectric conversion elements capable of generating an electrical signal in response to a change in the amount of light, and is not particularly limited to any one embodiment.

The encapsulation layer TFE is disposed on the element layer DP_ED. The encapsulation layer TFE includes at least an inorganic encapsulation layer or an organic encapsulation layer. In an embodiment of the present disclosure, the encapsulation layer TFE may include two inorganic encapsulation layers, and an organic encapsulation layer disposed therebetween. In an embodiment of the present disclosure, the encapsulation layer TFE may include a plurality of inorganic encapsulation layers and a plurality of organic encapsulation layers that are alternately stacked one above another.

The inorganic encapsulation layers protect the red, green, and blue light emitting elements ED_R, ED_G1, ED_G2, and ED_B and the first light sensing element OPD1 from moisture and/or oxygen, and the organic encapsulation layers protect the red, green, and blue light emitting elements ED_R, ED_G1, ED_G2, and ED_B and the first light sensing element OPD1 from foreign matter, such as dust particles. The inorganic encapsulation layers may include, but are not particularly limited to, a silicon nitride layer, a silicon oxy-nitride layer, a silicon oxide layer, a titanium oxide layer, or an aluminum oxide layer. The organic encapsulation layers may include, but are not particularly limited to, an acrylate-based organic layer.

Figure 7:
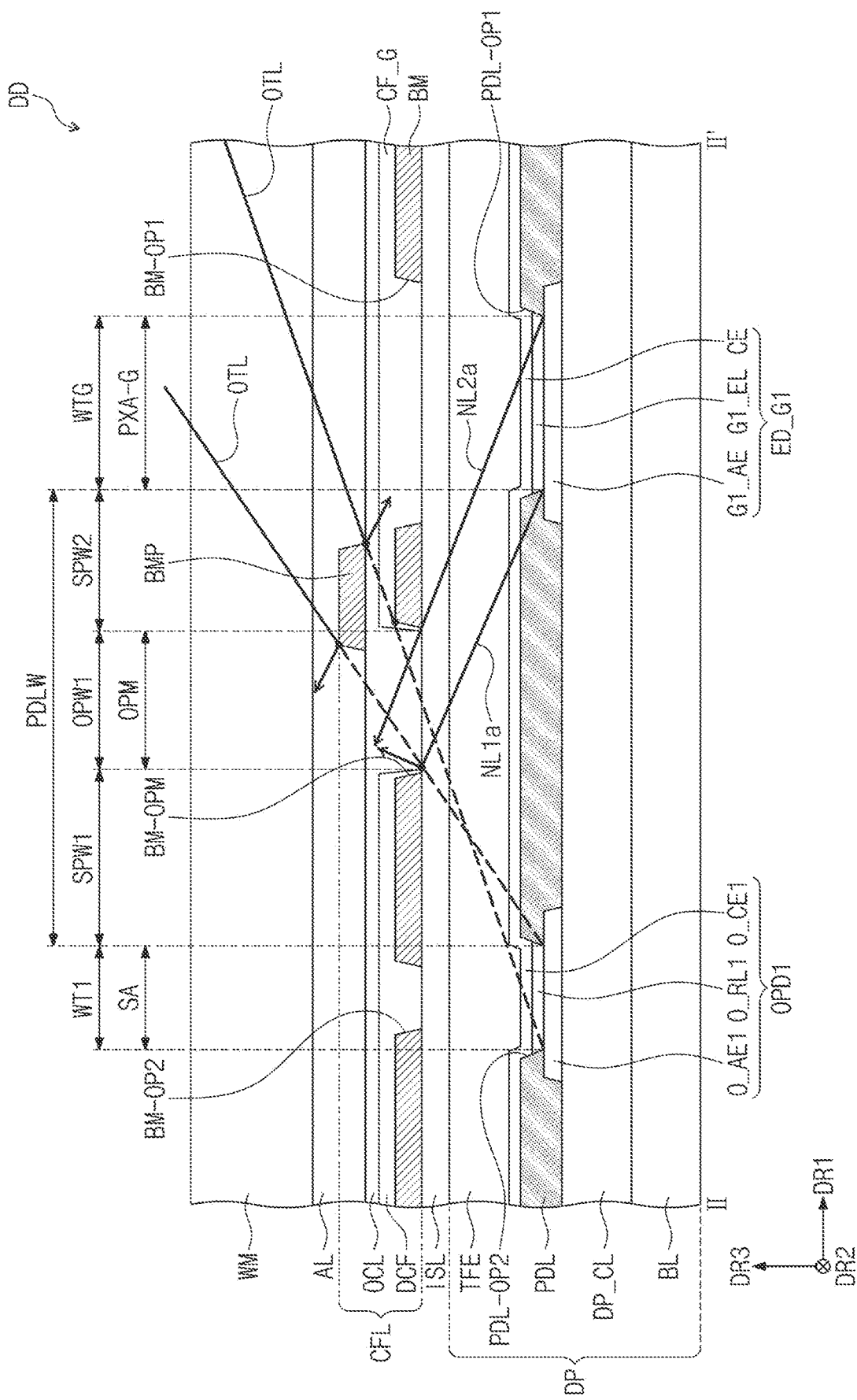
FIG. 7 is a cross-sectional view of the display device according to an embodiment of the present disclosure.

FIG. 7 is a cross-sectional view of the display device DD according to an embodiment of the present disclosure. FIG. 7 may correspond to a cross-section taken along the line II-II' illustrated in FIG. 4A. In FIG. 7, for convenience of illustration, a cross-section including one sensing area SA and one emissive area PXA-G is shown.

Referring to FIG. 7, the display device DD includes the display panel DP, the input sensing layer ISL disposed on the display panel DP, the anti-reflection layer CFL disposed on the input sensing layer ISL, and the window WM disposed on the anti-reflection layer CFL.

The input sensing layer ISL may be directly disposed on the encapsulation layer TFE. The input sensor layer ISL may sense an external input applied from the outside. The external input may include various suitable forms of inputs provided from the outside of the display device DD.

The anti-reflection layer CFL may be disposed on the input sensor layer ISL. The anti-reflection layer CFL may be directly disposed on the input sensing layer ISL. The anti-reflection layer CFL may include a light blocking layer BM, color filters CF_G and DCF, and an over-coating layer OCL.

The light blocking layer BM may be disposed on the input sensor layer ISL. The light blocking layer BM may have a property of reflecting or absorbing light. For example, the light blocking layer BM may contain a black material. The light blocking layer BM may additionally contain a black organic dye/pigment, such as carbon black, aniline black, or the like.

A plurality of openings BM-OP1, BM-OP2, and BM-OPM may be provided in (e.g., may penetrate) the light blocking layer BM. For example, the plurality of openings BM-OP1, BM-OP2, and BM-OPM may include a first opening BM-OP1 overlapping with the emissive area PXA-G, a second opening BM-OP2 overlapping with the sensing area SA, and an intermediate opening BM-OPM disposed between the first opening BM-OP1 and the second opening BM-OP2.

For example, the first opening BM-OP1 may overlap with the first film opening PDL-OP1. The second opening BM-OP2 may overlap with the second film opening PDL-OP2. The intermediate opening BM-OPM may overlap with a portion of the pixel defining film PDL between the first film opening PDL-OP1 and the second film opening PDL-OP2.

A size of the first film opening PDL-OP1 may be smaller than a size of the first opening BM-OP1, and a size of the second film opening PDL-OP2 may be larger than a size of the second opening BM-OP2. Because the size of the second opening BM-OP2 overlapping with the sensing area SA for sensing a fingerprint is smaller than the size of the second film opening PDL-OP2, a resolution of a fingerprint image may be increased. As used in the present specification, the sizes may refer to areas of the openings when viewed on the plane (e.g., in a plan view). The sizes may be determined by comparing widths of the openings on the cross-section. For example, when one opening is wider than another opening, it may be understood that the one opening has a larger size than that of the other opening.

The emissive area PXA-G and the sensing area SA may be spaced apart from each other in the first direction DR1, and the first opening BM-OP1, the intermediate opening BM-OPM, and the second opening BM-OP2 may be spaced apart from each other in the first direction DR1. The first direction DR1 may refer to a horizontal direction that is parallel to or substantially parallel to the first direction DR1. In other words, when viewed on the plane (e.g., in a plan view), for example, when viewed in/from the third direction DR3, the intermediate opening BM-OPM may be disposed between the first opening BM-OP1 and the second opening BM-OP2.

According to an embodiment of the present disclosure, the intermediate opening BM-OPM is defined in a partial area of the light blocking layer BM that overlaps with the area between the emissive area PXA-G and the sensing area SA. For example, the intermediate opening BM-OPM may be provided at (e.g., in or on) an intermediate area OPM. The intermediate area OPM may be defined as an area having a high probability that light output from the first green light emitting layer G1_EL is reflected or scattered by the light blocking layer BM, and is incident on the first photoelectric conversion layer O_RL1.

An area from a point that is in contact with a first outermost light path NL1a to a point that is in contact with a second outermost light path NL2a may correspond to the intermediate area OPM. For example, when assuming that the intermediate opening BM-OPM is not provided in the light blocking layer BM, the first outermost light path NL1a is the path of light incident from a left edge of the first green light emitting layer G1_EL to a left edge of the first photoelectric conversion layer O_RL1, and the second outermost light path NL2a is the path of light incident from the right edge of the first green light emitting layer G1_EL to the right edge of the first photoelectric conversion layer O_RL1.

According to an embodiment of the present disclosure, the intermediate opening BM-OPM is provided from which a portion of the light blocking layer BM overlapping with the intermediate area OPM is removed. Accordingly, light provided toward the intermediate area OPM may not be reflected or scattered toward the first photoelectric conversion layer O_RL1, and may pass through the intermediate opening BM-OPM or may be reflected, so as not to proceed toward the first photoelectric conversion layer O_RL1. Thus, a percentage of the amount of noise light reflected by an internal stacked structure in the amount of light incident on the first photoelectric conversion layer O_RL1 may be minimized or reduced. In other words, a percentage of an effective amount of light reflected from a fingerprint in the amount of light incident on the first photoelectric conversion layer O_RL1 may be increased. As a result, a signal-to-noise ratio (SNR) may be improved.

The width OPW1 of the intermediate opening BM-OPM in the first direction DR1 may be greater than or equal to the width WTG of the emissive area PXA-G in the first direction DR1 plus the width WT1 of the sensing area SA in the first direction DR1 and divided by 2 (e.g., OPW1≥(WTG+WT1)/2). The width OPW1 of the intermediate opening BM-OPM in the first direction DR1 may be smaller than the sum of the width WTG of the emissive area PXA-G in the first direction DR1 and the width WT1 of the sensing area SA in the first direction DR1 (e.g., OPW1<(WTG+WT1)). For example, as the width OPW1 is increased, a probability that noise light reflected or scattered by an internal stacked structure and is incident on the first photoelectric conversion layer O_RL1 may be further decreased. However, as the width OPW1 is increased, a probability that external light OTL is incident may be increased. Accordingly, in an embodiment, the width OPW1 may be the same or substantially the same as (e.g., approximately equal to) the width WTG of the emissive area PXA-G in the first direction DR1 plus the width WT1 of the sensing area SA in the first direction DR1 and divided by 2 (e.g., OPW1≈(WTG+WT1)/2).

When viewed on the plane (e.g., in a plan view), the distance SPW2 between the intermediate opening BM-OPM and the first film opening PDL-OP1 may correspond to (e.g., may be equal to or approximately equal to) the distance PDLW between the first film opening PDL-OP1 and the second film opening PDL-OP2 minus the width WTG of the emissive area PXA-G in the first direction DR1 and divided by 2 (e.g., SPW2≈(PDLW−WTG)/2).

When viewed on the plane (e.g., in a plan view), the distance SPW1 between the intermediate opening BM-OPM and the second film opening PDL-OP2 may correspond to (e.g., may be equal to or approximately equal to) the distance PDLW between the first film opening PDL-OP1 and the second film opening PDL-OP2 minus the width WT1 of the sensing area SA in the first direction DR1 and divided by 2 (e.g., SPW1≈(PDLW−WT1)/2).

The color filters CF_G and DCF may include a red color filter, a green color filter CF_G, a blue color filter, and a dummy color filter DCF. For example, the red color filter may overlap with the red light emitting element ED_R (e.g., refer to FIG. 4A), the green color filter CF_G may overlap with the green light emitting element ED_G1, and the blue color filter CF_B may overlap with the blue light emitting element ED_B.

The dummy color filter DCF may overlap with the first light sensing element OPD1. The dummy color filter DCF may have the same or substantially the same color as that of one of the red color filter, the green color filter CF_G, and the blue color filter. For example, the dummy color filter DCF may have the same or substantially the same green color as that of the green color filter CF_G. Each of the dummy color filter DCF and the green color filter CF_G may have an island shape. In this case, the dummy color filter DCF and the green color filter CF_G may not overlap with the intermediate area OPM, and may be spaced apart from each other. In an embodiment of the present disclosure, the dummy color filter DCF and the green color filter CF_G may be connected with each other to form an integral shape. In this case, an opening may be defined in (e.g., may penetrate) a color filter overlapping with the intermediate area OPM. However, the present disclosure is not limited thereto, and the dummy color filter DCF may be omitted when the first light sensing element OPD1 recognizes a fingerprint using light (e.g., green light and blue light, or green light and red light) provided from light sources having different colors from each other. In this case, the dummy color filter DCF may not be disposed in the second opening BM-OP2, and the second opening BM-OP2 may be filled with the overcoating layer OCL.

The over-coating layer OCL may be disposed on the light blocking layer BM, and may cover the plurality of color filters CF_G and DCF. A portion of the over-coating layer OCL may fill the intermediate opening BM-OPM. The over-coating layer OCL may contain an organic insulating material, but is not particularly limited thereto. The over-coating layer OCL may have a thickness sufficient to remove or reduce steps formed between the color filters CF_G and DCF. Without being particularly limited, the over-coating layer OCL may include any suitable material that has a suitable thickness (e.g., a predetermined thickness), and is capable of flattening or substantially flattening the upper surface of the anti-reflection layer CFL. For example, the over-coating layer OCL may include an acrylate-based organic material.

A light blocking pattern BMP may be disposed on the over-coating layer OCL. The light blocking pattern BMP may prevent or substantially prevent the external light OTL from being incident on the first photoelectric conversion layer O_RL1 through the intermediate opening BM-OPM. Accordingly, the position of the light blocking pattern BMP may be determined in consideration of the position of the intermediate opening BM-OPM and the position of the sensing area SA.

The light blocking pattern BMP may include the same material as that of the light blocking layer BM, but is not particularly limited thereto. For example, when viewed on the plane (e.g., in a plan view), the light blocking pattern BMP may overlap with the area between the intermediate opening BM-OPM and the first opening BM-OP1. Furthermore, when viewed on the plane (e.g., in a plan view), a portion of the light blocking pattern BMP may overlap with the intermediate opening BM-OPM.

Figure 8:
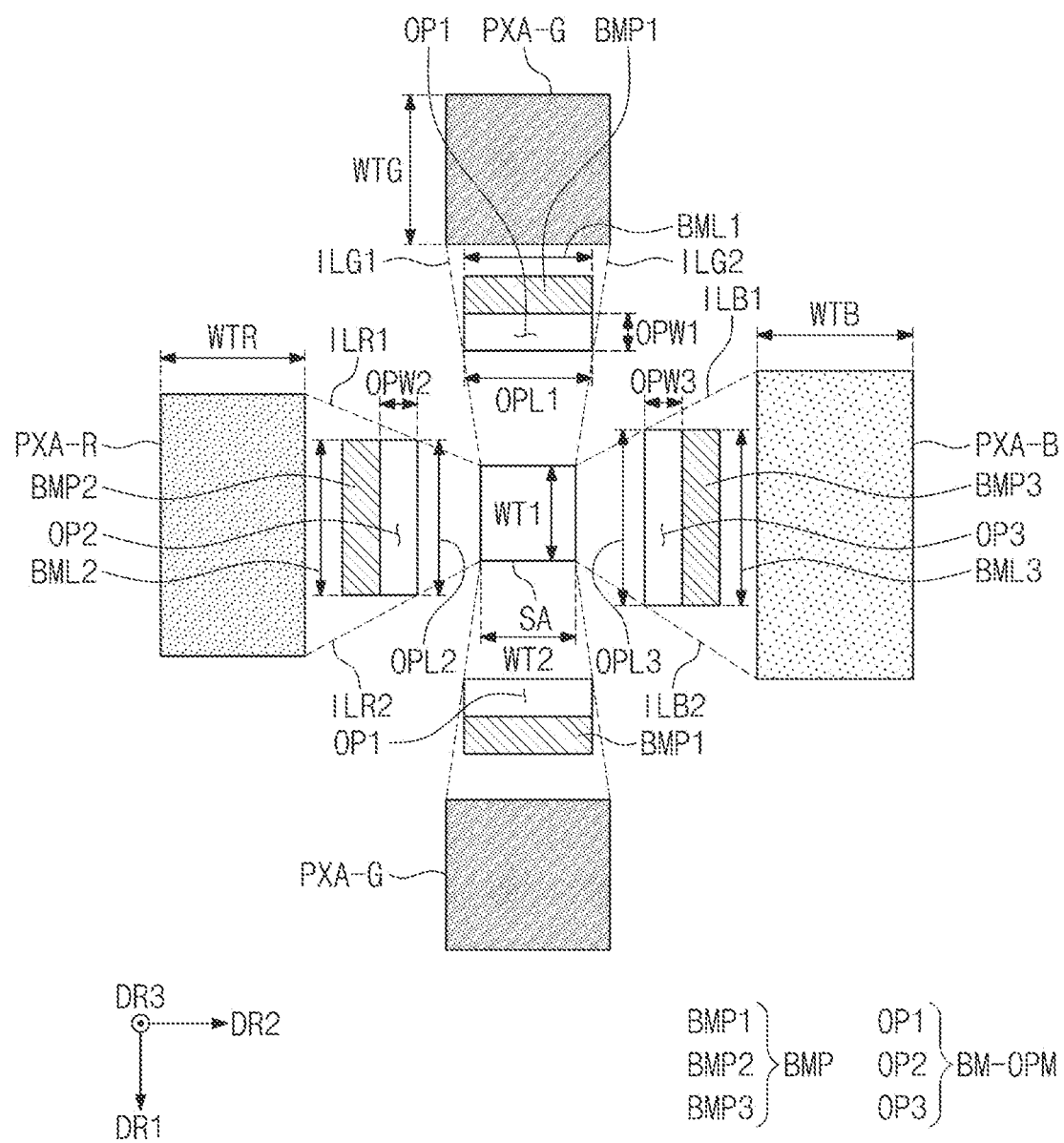
FIG. 8 is a plan view illustrating some components of the display device according to an embodiment of the present disclosure.

FIG. 8 is a plan view illustrating some components of the display device according to an embodiment of the present disclosure.

Referring to FIGS. 7 and 8, four emissive areas PXA-G, PXA-R, and PXA-B, and one sensing area SA are illustrated. The four emissive areas PXA-G, PXA-R, and PXA-B may include the two first emissive areas PXA-G, the second emissive area PXA-R, and the third emissive area PXA-B.

A plurality of intermediate openings BM-OPM may be provided. The intermediate openings BM-OPM may include first intermediate openings OP1 disposed between the first emissive areas PXA-G and the sensing area SA, a second intermediate opening OP2 disposed between the second emissive area PXA-R and the sensing area SA, and a third intermediate opening OP3 disposed between the third emissive area PXA-B and the sensing area SA. The intermediate opening BM-OPM illustrated in FIG. 7 may be the first intermediate opening OP1.

A plurality of light blocking patterns BMP may be provided. The light blocking patterns BMP may include first light blocking patterns BMP1 disposed between the first intermediate openings OP1 and the first emissive areas PXA-G, a second light blocking pattern BMP2 disposed between the second emissive area PXA-R and the second intermediate opening OP2, and a third light blocking pattern BMP3 disposed between the third emissive area PXA-B and the third intermediate opening OP3.

Two first outermost lines ILG1 and ILG2 connected with the first emissive area PXA-G and the sensing area SA, and spaced apart from each other in the second direction DR2 crossing the first direction DR1, are defined. When viewed on the plane (e.g., in a plan view), the first intermediate opening OP1 may overlap with the first outermost lines ILG1 and ILG2. For example, the width OPL1 of the first intermediate opening OP1 in the second direction DR2 may be greater than or equal to the width WT2 of the sensing area SA in the second direction DR2, and may be smaller than or equal to the width of the first emissive area PXA-G in the second direction DR2. Furthermore, the width BML1 of the first light blocking pattern BMP1 in the second direction DR2 may be the same or substantially the same as the width OPL1 of the first intermediate opening OP1 in the second direction DR2.

The size of the first intermediate opening OP1 illustrated in FIG. 8 may correspond to the minimum size of the first intermediate opening OP1. In other words, the width OPL1 of the first intermediate opening OP1 in the second direction DR2 may be greater than that of the first intermediate opening OP1 illustrated in FIG. 8. Because the first intermediate opening OP1 overlaps with the two first outermost lines ILG1 and ILG2, a probability that noise light reflected or scattered by an internal stacked structure is incident on the first photoelectric conversion layer O_RL1 may be decreased or eliminated.

The width OPW2 of the second intermediate opening OP2 in the second direction DR2 may be equal to or substantially equal to the width WTR of the second emissive area PXA-R in the second direction DR2 plus the width WT2 of the sensing area SA in the second direction DR2 and divided by 2 (e.g., OPW2=(WTR+WT2)/2). Two second outermost lines ILR1 and ILR2 connected with the second emissive area PXA-R and the sensing area SA, and spaced apart from each other in the first direction DR1 may be defined, and the width OPL2 of the second intermediate opening OP2 in the first direction DR1 may be defined such that the second intermediate opening OP2 overlaps with the second outermost lines ILR1 and ILR2. The width BML2 of the second light blocking pattern BMP2 in the first direction DR1 may be the same or substantially the same as the width OPL2 of the second intermediate opening OP2 in the first direction DR1.

The width OPW3 of the third intermediate opening OP3 in the second direction DR2 may be equal to or substantially equal to the width WTB of the third emissive area PXA-B in the second direction DR2 plus the width WT2 of the sensing area SA in the second direction DR2 and divided by 2 (e.g., OPW3=(WTB+WT2)/2). Two third outermost lines ILB1 and ILB2 connected with the third emissive area PXA-B and the sensing area SA, and spaced apart from each other in the first direction DR1 may be defined, and the width OPL3 of the third intermediate opening OP3 in the first direction DR1 may be defined such that the third intermediate opening OP3 overlaps with the third outermost lines ILB1 and ILB2. The width BML3 of the third light blocking pattern BMP3 in the first direction DR1 may be the same or substantially the same as the width OPL3 of the third intermediate opening OP3 in the first direction DR1.

In the embodiment illustrated in FIG. 8, the sensor FX (e.g., refer to FIG. 3) may recognize a fingerprint using at least one of green light, red light, and blue light. For example, when the sensor FX recognizes a fingerprint using only one of green light, red light, and blue light, a dummy color filter having a color corresponding to the color used for the recognition of the fingerprint may be disposed at (e.g., in or on) the sensing area SA. Furthermore, when the sensor FX recognizes a fingerprint using a plurality of light beams having different colors from each other, a dummy color filter may not be disposed at (e.g., in or on) the sensing area SA.

Figure 9:
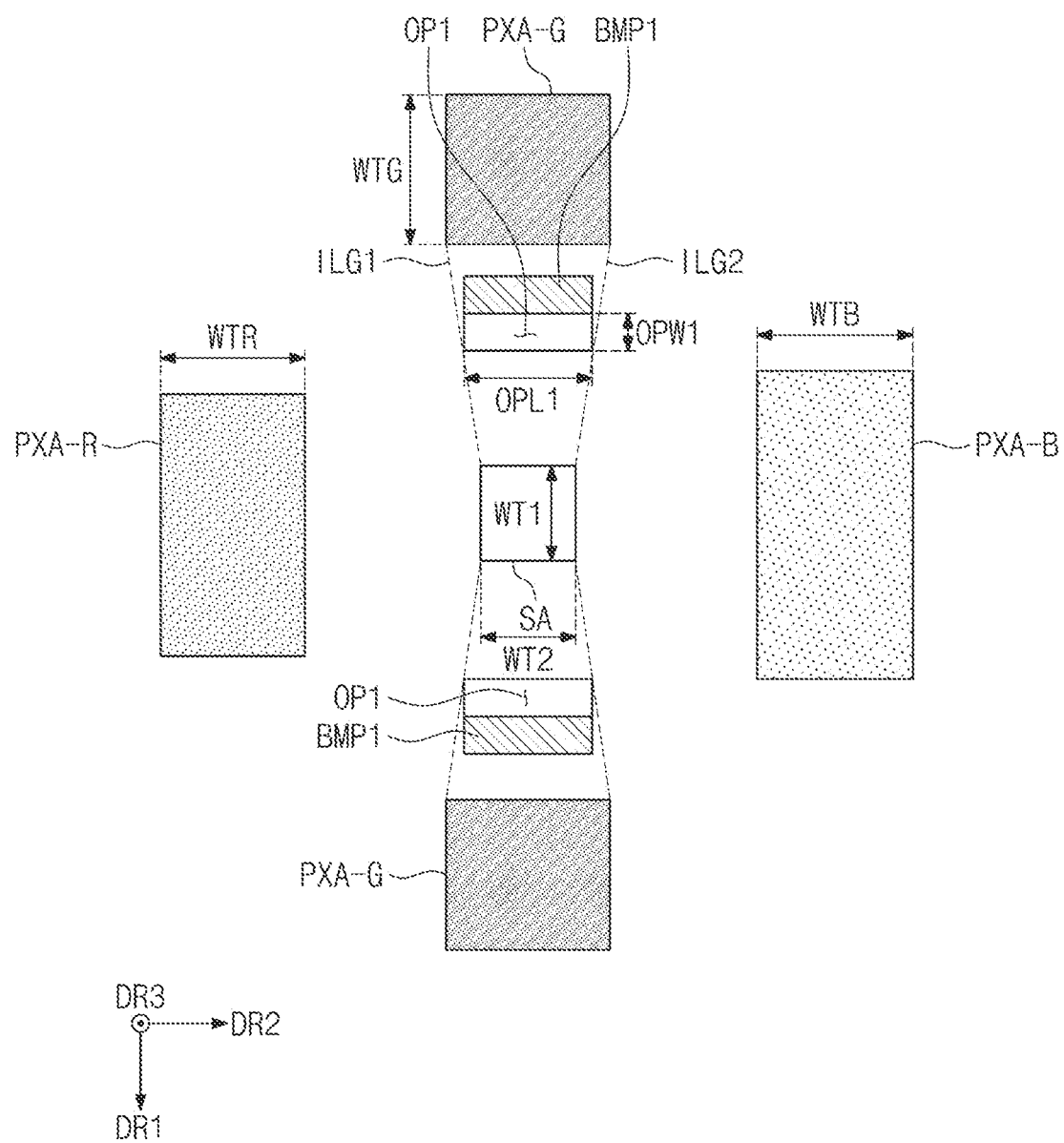
FIG. 9 is a plan view illustrating some components of the display device according to an embodiment of the present disclosure.

FIG. 9 is a plan view illustrating some components of the display device according to an embodiment of the present disclosure.

Referring to FIGS. 7 and 9, the sensor FX (e.g., refer to FIG. 3) may recognize a fingerprint using green light. In this case, the dummy color filter DCF may be a green color filter.

A plurality of intermediate openings BM-OPM may be provided. The intermediate openings BM-OPM may include first intermediate openings OP1 disposed between the first emissive areas PXA-G and the sensing area SA. A plurality of light blocking patterns BMP may be provided. The light blocking patterns BMP may include first light blocking patterns BMP1 disposed between the first intermediate openings OP1 and the first emissive areas PXA-G.

Figure 10:
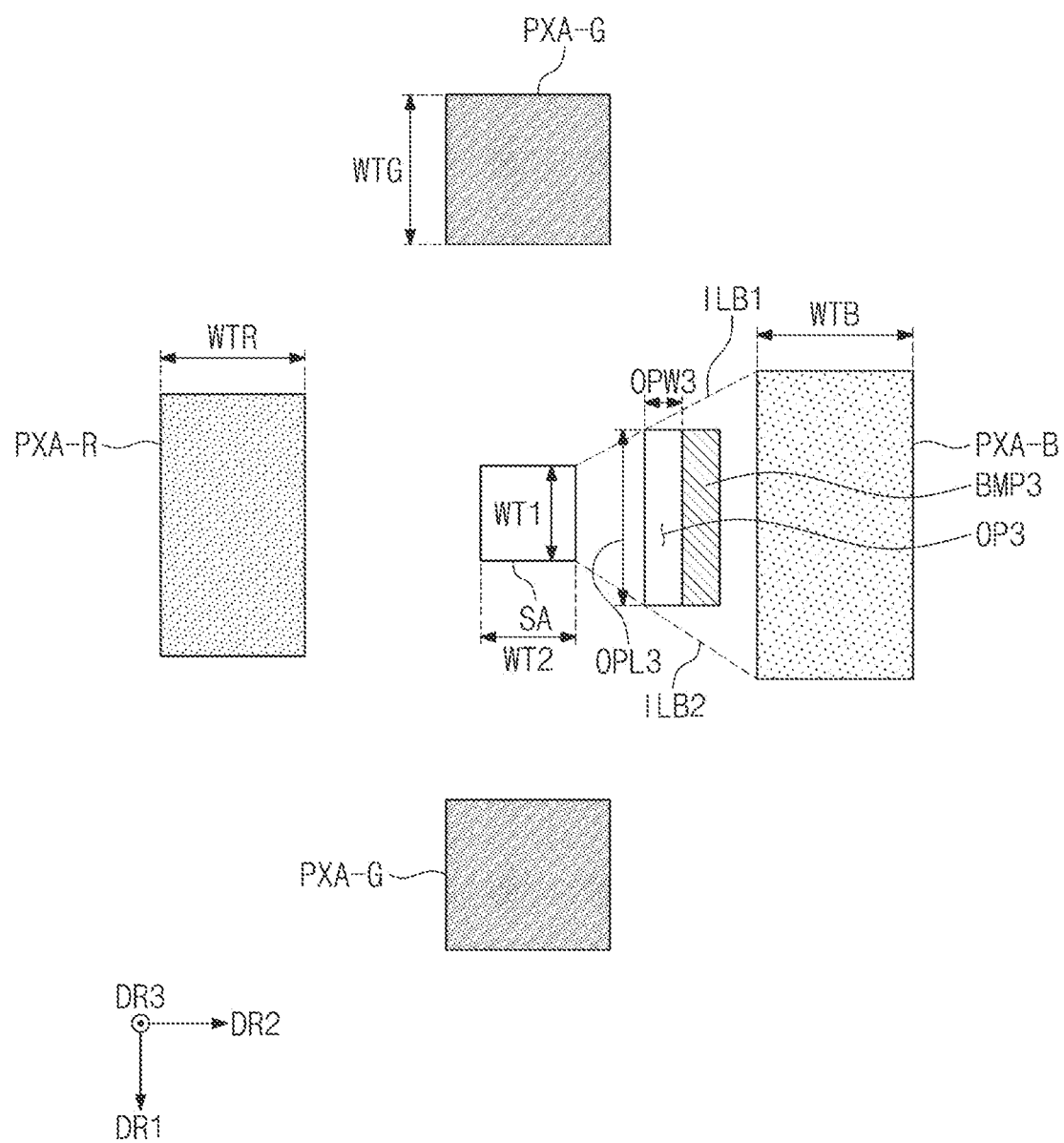
FIG. 10 is a plan view illustrating some components of the display device according to an embodiment of the present disclosure.

FIG. 10 is a plan view illustrating some components of the display device according to an embodiment of the present disclosure.

In the embodiment illustrated in FIG. 10, the sensor FX (e.g., refer to FIG. 3) may recognize a fingerprint using blue light. The intermediate opening BM-OPM (e.g., refer to FIG. 7) may be a third intermediate opening OP3 disposed between the third emissive area PXA-B and the sensing area SA, and the light blocking pattern BMP may be a third light blocking pattern BMP3. In this case, the dummy color filter DCF overlapping with the sensing area SA may be a blue color filter.

Figure 11:
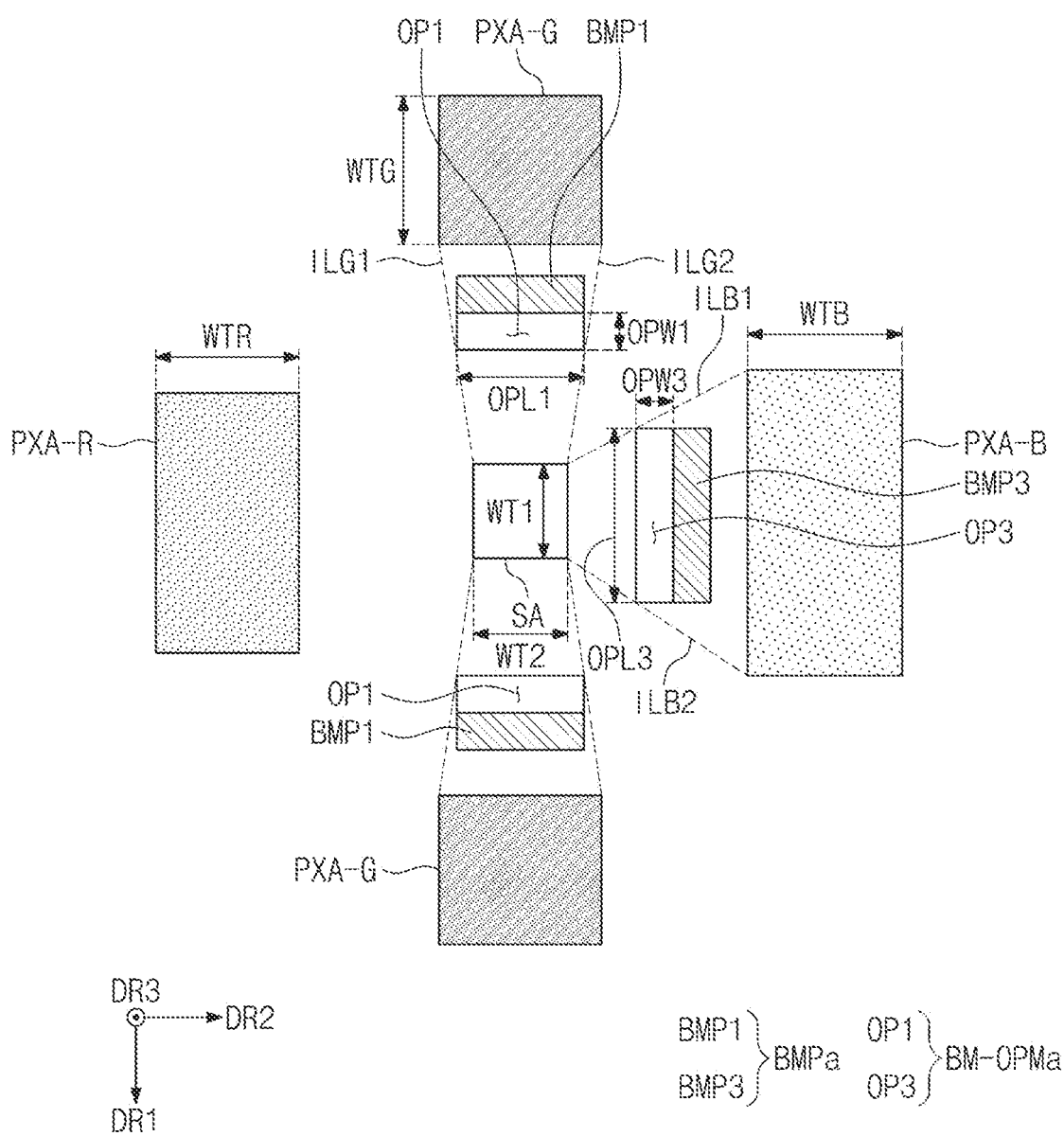
FIG. 11 is a plan view illustrating some components of the display device according to an embodiment of the present disclosure.

FIG. 11 is a plan view illustrating some components of the display device according to an embodiment of the present disclosure.

In the embodiment illustrated in FIG. 11, the sensor FX (e.g., refer to FIG. 3) may recognize a fingerprint using green light and blue light. In this case, the dummy color filter DCF overlapping with the sensing area SA is omitted.

A plurality of intermediate openings BM-OPMa may be provided. The intermediate openings BM-OPMa may include first intermediate openings OP1 disposed between the first emissive areas PXA-G and the sensing area SA, and a third intermediate opening OP3 disposed between the third emissive area PXA-B and the sensing area SA.

A plurality of light blocking patterns BMPa may be provided. The light blocking patterns BMPa may include first light blocking patterns BMP1 disposed between the first intermediate openings OP1 and the first emissive areas PXA-G, and a third light blocking pattern BMP3 disposed between the third emissive area PXA-B and the third intermediate opening OP3.

Figure 12:
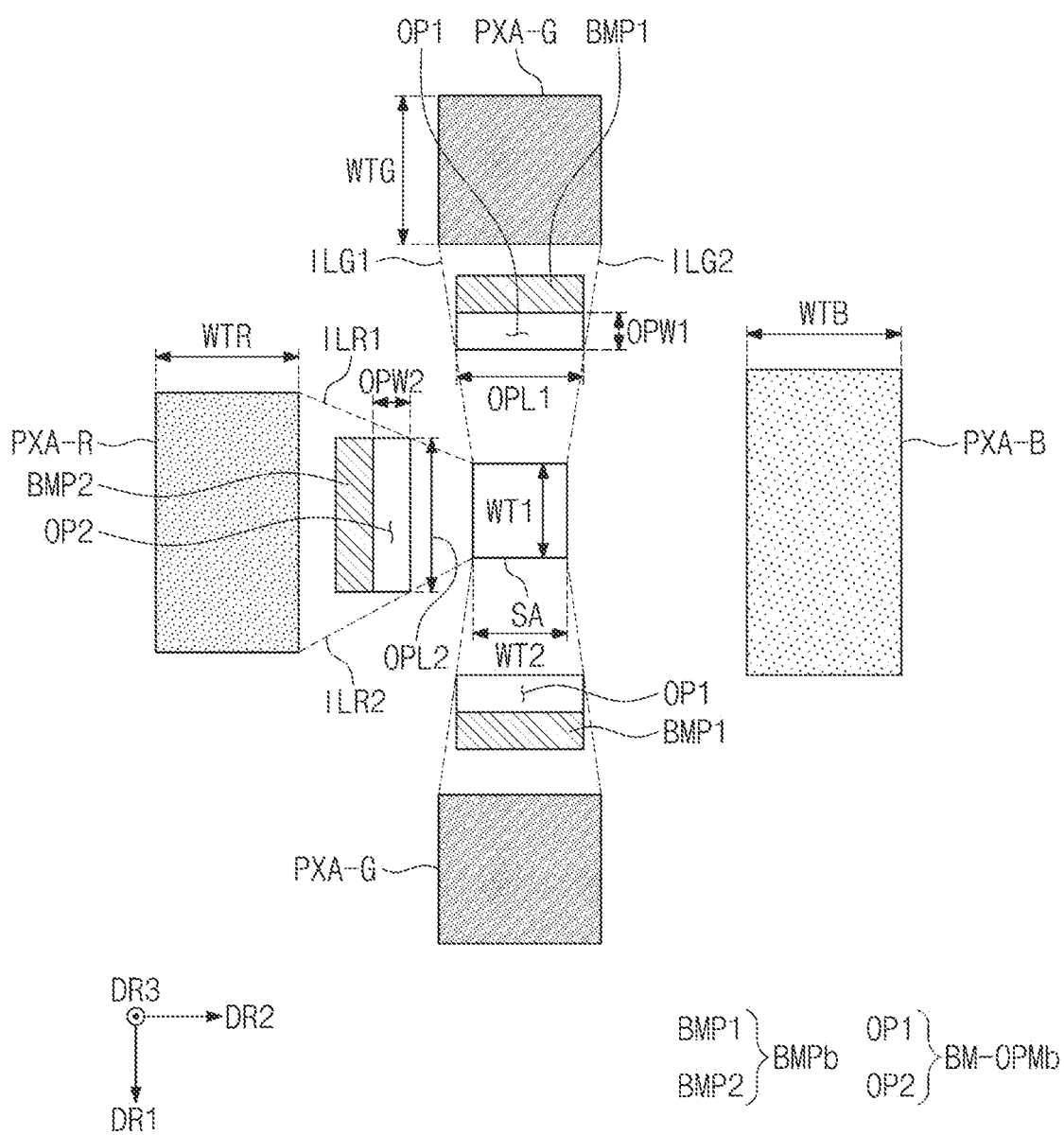
FIG. 12 is a plan view illustrating some components of the display device according to an embodiment of the present disclosure.

FIG. 12 is a plan view illustrating some components of the display device according to an embodiment of the present disclosure.

In the embodiment illustrated in FIG. 12, the sensor FX (e.g., refer to FIG. 3) may recognize a fingerprint using green light and red light. In this case, the dummy color filter DCF overlapping with the sensing area SA is omitted.

A plurality of intermediate openings BM-OPMb may be provided. The intermediate openings BM-OPMb may include first intermediate openings OP1 disposed between the first emissive areas PXA-G and the sensing area SA, and a second intermediate opening OP2 disposed between the second emissive area PXA-R and the sensing area SA.

A plurality of light blocking patterns BMPb may be provided. The light blocking patterns BMPb may include first light blocking patterns BMP1 disposed between the first intermediate openings OP1 and the first emissive areas PXA-G, and a second light blocking pattern BMP2 disposed between the second emissive area PXA-R and the second intermediate opening OP2.

Figure 13:
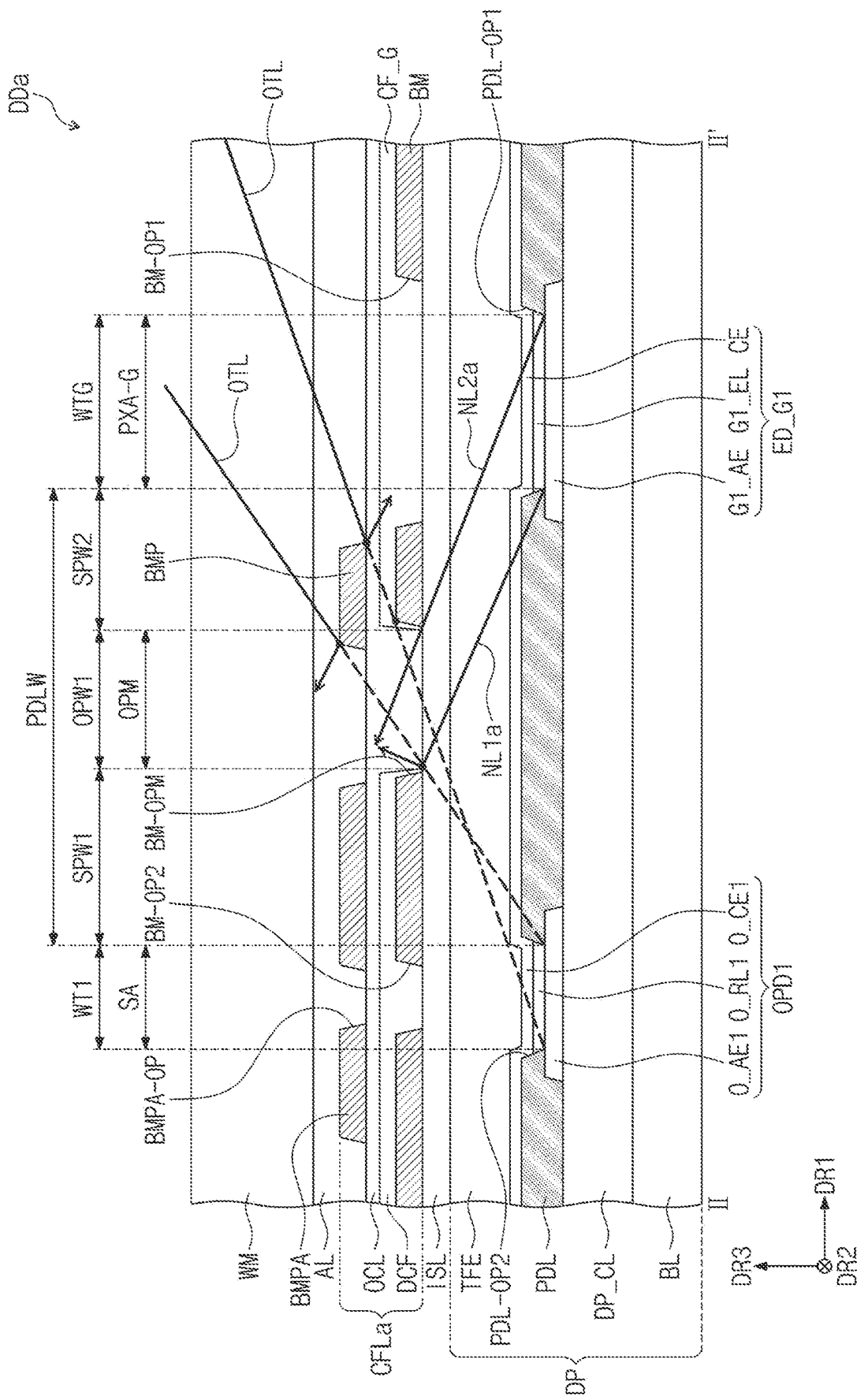
FIG. 13 is a cross-sectional view of a display device according to an embodiment of the present disclosure.
Figure 14:
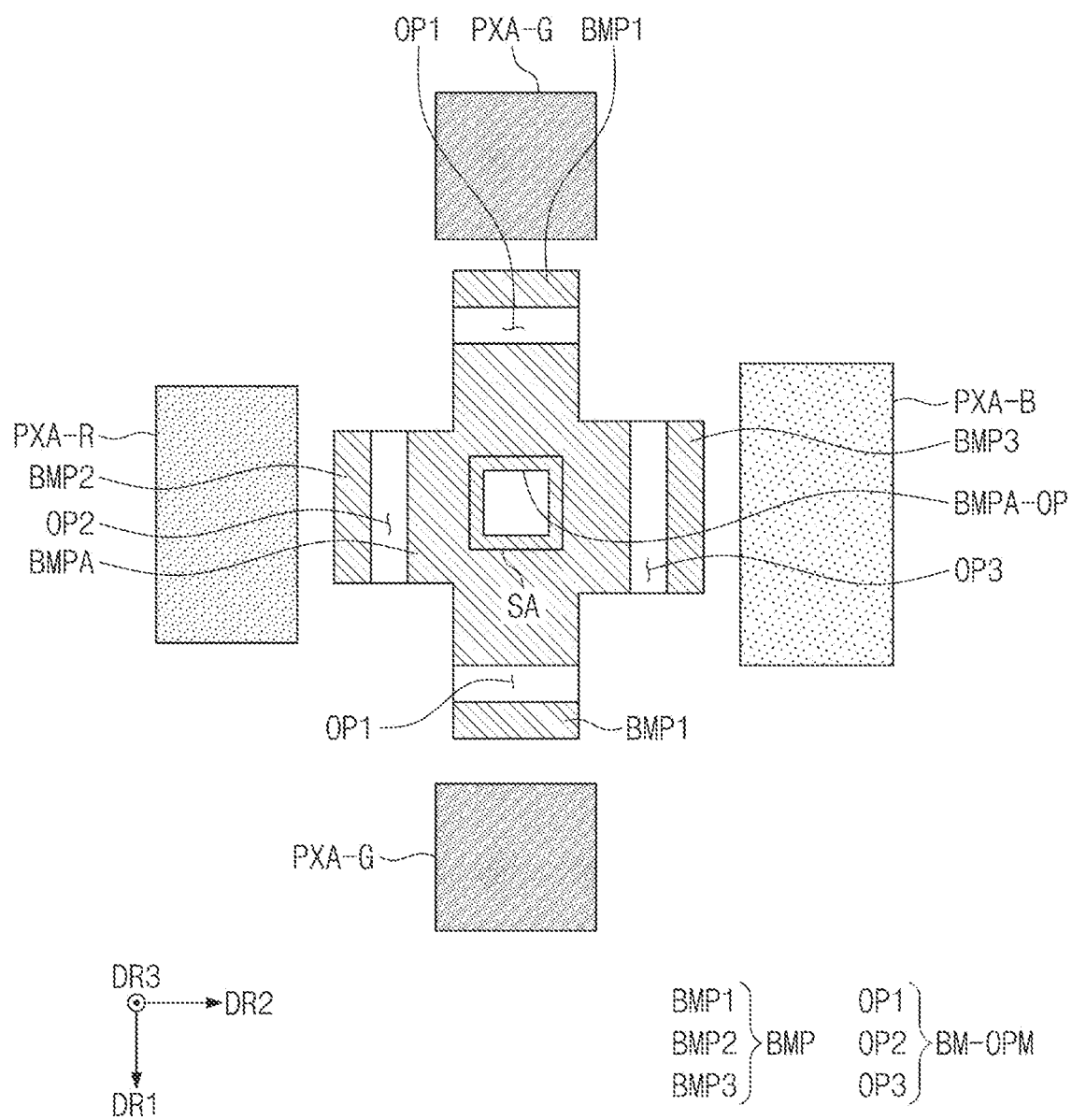
FIG. 14 is a plan view illustrating some components of the display device according to an embodiment of the present disclosure.

FIG. 13 is a cross-sectional view of a display device DDa according to an embodiment of the present disclosure. FIG. 14 is a plan view illustrating some components of the display device according to an embodiment of the present disclosure.

Referring to FIGS. 13 and 14, an anti-reflection layer CFLa of the display device DDa may further include an additional light blocking pattern BMPA. The additional light blocking pattern BMPA may be disposed on the over-coating layer OCL, and may be disposed at (e.g., in or on) the same layer as that of the light blocking pattern BMP. The light blocking pattern BMP and the additional light blocking pattern BMPA may contain the same material as each other, and may be concurrently (e.g., simultaneously or substantially simultaneously) formed through the same process.

The additional light blocking pattern BMPA may have an overlapping opening BMPA-OP that overlaps with the second opening BM-OP2. The size of the overlapping opening BMPA-OP may be equal to or substantially equal to the size of the second opening BM-OP2, or may be smaller than the size of the second opening BM-OP2.

In this case, the additional light blocking pattern BMPA having the overlapping opening BMPA-OP defined therein to overlap with a light sensing element OPD1 is disposed on the over-coating layer OCL. In other words, when the present embodiment is compared with the embodiment illustrated in FIG. 7, the overlapping opening BMPA-OP may be defined in a position farther away from the light sensing element OPD1 than that of the second opening BM-OP2. In this case, the resolution of a sensed fingerprint may be further improved. For example, as an opening overlapping with a sensing area SA becomes farther away, the area of a fingerprint sensing area defined at (e.g., in or on) an upper surface of a window WM may be decreased, and thus, the resolution may be improved.

Figure 15:
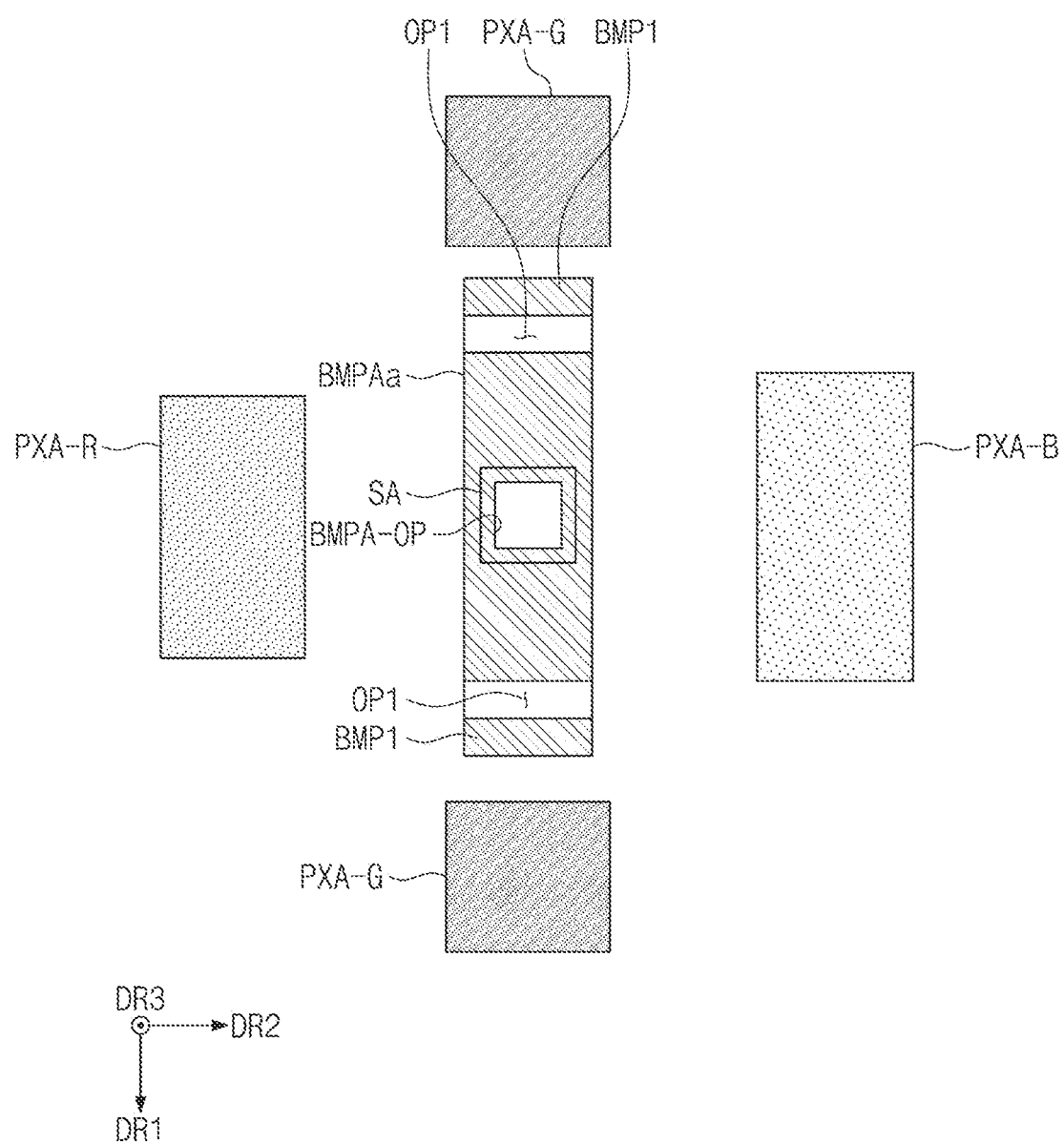
FIG. 15 is a plan view illustrating some components of the display device according to an embodiment of the present disclosure.

FIG. 15 is a plan view illustrating some components of the display device according to an embodiment of the present disclosure.

FIG. 15 is a view illustrating an embodiment in which an additional light blocking pattern BMPAa similar to the additional light blocking pattern BMPA described above with reference to FIGS. 13 and 14 is applied to the embodiment illustrated in FIG. 9.

The additional light blocking pattern BMPAa may have an overlapping opening BMPA-OP defined therein through which a portion of the sensing area SA is exposed. The additional light blocking pattern BMPAa may have an edge surrounding (e.g., around a periphery of) the edge of the sensing area SA. The additional light blocking pattern BMPAa may be additionally applied to the embodiments illustrated in FIGS. 10, 11, and 12, in a like manner.

According to one or more embodiments of the present disclosure described above, the light blocking layer has the intermediate opening from which the portion overlapping with the intermediate area between the sensing area and the emissive area is removed. Accordingly, light provided toward the intermediate area may not be reflected or scattered toward the photoelectric conversion layer, and may pass through the intermediate opening or may be reflected, so as not to proceed toward the photoelectric conversion layer. Thus, the percentage of the amount of noise light reflected by the internal stacked structure in the amount of light incident on the photoelectric conversion layer may be minimized or reduced. In other words, the percentage of the effective amount of light reflected from a fingerprint in the amount of light incident on the photoelectric conversion layer may be increased. Accordingly, the signal-to-noise ratio (SNR) may be improved.

Although some embodiments have been described, those skilled in the art will readily appreciate that various modifications are possible in the embodiments without departing from the spirit and scope of the present disclosure. It will be understood that descriptions of features or aspects within each embodiment should typically be considered as available for other similar features or aspects in other embodiments, unless otherwise described. Thus, as would be apparent to one of ordinary skill in the art, features, characteristics, and/or elements described in connection with a particular embodiment may be used singly or in combination with features, characteristics, and/or elements described in connection with other embodiments unless otherwise specifically indicated. Therefore, it is to be understood that the foregoing is illustrative of various example embodiments and is not to be construed as limited to the specific embodiments disclosed herein, and that various modifications to the disclosed embodiments, as well as other example embodiments, are intended to be included within the spirit and scope of the present disclosure as defined in the appended claims, and their equivalents.

What is claimed is:

1. A display device comprising:
a display panel comprising a pixel having an emissive area, and a sensor having a sensing area; and
an anti-reflection layer on the display panel, the anti-reflection layer comprising:
a light blocking layer having a first opening overlapping with the emissive area, a second opening overlapping with the sensing area, and an intermediate opening between the first opening and the second opening;
a color filter covering the first opening;
an over-coating layer on the light blocking layer, and covering the color filter; and
a light blocking pattern on the over-coating layer, and overlapping with an area between the intermediate opening and the first opening.

2. The display device of claim 1, wherein the emissive area and the sensing area are spaced from each other in a first direction, and
wherein the first opening, the intermediate opening, and the second opening are spaced from each other in the first direction.

3. The display device of claim 2, wherein a width of the intermediate opening in the first direction is greater than or equal to a width of the emissive area in the first direction plus a width of the sensing area in the first direction and divided by 2.

4. The display device of claim 2, wherein two outermost lines connected with the emissive area and the sensing area, and spaced from each other in a second direction crossing the first direction are defined, and
wherein the intermediate opening overlaps with the two outermost lines in a plan view.

5. The display device of claim 4, wherein a width of the intermediate opening in the second direction is the same as a width of the light blocking pattern in the second direction.

6. The display device of claim 2, wherein the display panel further comprises a pixel defining film having a first film opening defining the emissive area, and a second film opening defining the sensing area, and
wherein the intermediate opening overlaps with a portion of the pixel defining film between the first film opening and the second film opening in a plan view.

7. The display device of claim 6, wherein in a plan view, a distance between the intermediate opening and the first film opening is equal to a distance between the first film opening and the second film opening minus a width of the emissive area in the first direction and divided by 2.

8. The display device of claim 6, wherein in a plan view, a distance between the intermediate opening and the second film opening is equal to a distance between the first opening and the second opening minus a width of the sensing area in the first direction and divided by 2.

9. The display device of claim 6, wherein the first film opening has a smaller size than that of the first opening, and the second film opening has a larger size than that of the second opening.

10. The display device of claim 1, wherein the anti-reflection layer further comprises an additional light blocking pattern on the over-coating layer, the additional light blocking pattern having an overlapping opening overlapping with the second opening in a plan view.

11. The display device of claim 1, wherein the intermediate opening is filled with a portion of the over-coating layer.

12. The display device of claim 1, further comprising:
a dummy color filter covering the second opening,
wherein the dummy color filter and the color filter do not overlap with the intermediate opening.

13. The display device of claim 1, wherein a portion of the light blocking pattern overlaps with the intermediate opening in a plan view.

14. A display device comprising:
a display panel comprising a pixel having an emissive area, and a sensor having a sensing area; and
an anti-reflection layer on the display panel, the anti-reflection layer comprising:

a light blocking layer having a plurality of openings including a first opening overlapping with the emissive area, a second opening overlapping with the sensing area, and an intermediate opening between the first opening and the second opening;

a plurality of color filters overlapping with some of the plurality of openings; and an over-coating layer covering the plurality of color filters, and filled in the intermediate opening, wherein the plurality of color filters do not overlap with the intermediate opening.

15. The display device of claim 14, wherein the plurality of color filters comprise a dummy color filter covering the second opening, and wherein the dummy color filter does not overlap with the intermediate opening.

16. A display device comprising:

a display panel comprising a pixel having an emissive area, and a sensor having a sensing area; and an anti-reflection layer on the display panel, the anti-reflection layer comprising:

a light blocking layer having a plurality of openings including a first opening overlapping with the emissive area, a second opening overlapping with the sensing area, and an intermediate opening between the first opening and the second opening; and a plurality of color filters overlapping with some of the plurality of openings, wherein the plurality of color filters do not overlap with the intermediate opening, and wherein the anti-reflection layer further comprises:

an over-coating layer covering the plurality of color filters; and a light blocking pattern on the over-coating layer, and overlapping with an area between the intermediate opening and the first opening.

17. The display device of claim 16, wherein the emissive area and the sensing area are spaced from each other in a first direction, and the first opening, the intermediate opening, and the second opening are spaced from each other in the first direction, and wherein a width of the intermediate opening in the first direction is greater than or equal to a width of the emissive area in the first direction plus a width of the sensing area in the first direction and divided by 2.

18. The display device of claim 16, wherein the emissive area and the sensing area are spaced from each other in a first direction, wherein two outermost lines connected with the emissive area and the sensing area, and spaced from each other in a second direction crossing the first direction are defined, and wherein the intermediate opening overlaps with the two outermost lines in a plan view.

19. The display device of claim 16, wherein the emissive area and the sensing area are spaced from each other in a first direction, wherein the display panel further comprises a pixel defining film having a first film opening defining the emissive area, and a second film opening defining the sensing area, wherein in a plan view, a distance between the intermediate opening and the first film opening is equal to a distance between the first film opening and the second film opening minus a width of the emissive area in the first direction and divided by 2, and wherein in a plan view, a distance between the intermediate opening and the second film opening is equal to a distance between the first opening and the second opening minus a width of the sensing area in the first direction and divided by 2.

20. The display device of claim 16, wherein the anti-reflection layer further comprises an additional light blocking pattern on the over-coating layer, the additional light blocking pattern having an overlapping opening overlapping with the second opening in a plan view.

* * * * *